(12) United States Patent
Hara et al.

(10) Patent No.: US 9,970,103 B2
(45) Date of Patent: May 15, 2018

(54) FILM DEPOSITION MATERIAL, SEALING FILM USING THE SAME AND USE THEREOF

(71) Applicants: Daiji Hara, Kanagawa (JP); Masato Shimizu, Kanagawa (JP)

(72) Inventors: Daiji Hara, Kanagawa (JP); Masato Shimizu, Kanagawa (JP)

(73) Assignee: TOSOH CORPORATION, Yamaguchi (JP)

( * ) Notice: Subject to any disclaimer, the term of this patent is extended or adjusted under 35 U.S.C. 154(b) by 0 days. days.

(21) Appl. No.: 15/212,895

(22) Filed: Jul. 18, 2016

(65) Prior Publication Data

US 2016/0326642 A1 Nov. 10, 2016

Related U.S. Application Data

(63) Continuation of application No. 14/342,834, filed as application No. PCT/JP2012/071487 on Aug. 24, 2012, now abandoned.

(30) Foreign Application Priority Data

Sep. 5, 2011 (JP) ................................ 2011-192741

(51) Int. Cl.
| | |
|---|---|
| C23C 16/40 | (2006.01) |
| H01L 21/02 | (2006.01) |
| C23C 16/30 | (2006.01) |
| C23C 16/50 | (2006.01) |

(52) U.S. Cl.
CPC ............ C23C 16/401 (2013.01); C23C 16/30 (2013.01); C23C 16/50 (2013.01); H01L 21/02126 (2013.01); H01L 21/02216 (2013.01); H01L 21/02274 (2013.01)

(58) Field of Classification Search
USPC ........................................ 556/430, 453, 487
See application file for complete search history.

(56) References Cited

U.S. PATENT DOCUMENTS

| | | | |
|---|---|---|---|
| 5,342,984 A | 8/1994 | Kubota et al. | |
| 5,614,505 A | 3/1997 | Gmeiner et al. | |
| 2003/0064154 A1* | 4/2003 | Laxman ................ | C07F 7/0859 427/255.28 |
| 2003/0180550 A1 | 9/2003 | Hara et al. | |
| 2006/0127683 A1 | 6/2006 | Hara et al. | |
| 2006/0151884 A1 | 6/2006 | Hara et al. | |

FOREIGN PATENT DOCUMENTS

| | | | | |
|---|---|---|---|---|
| JP | 2003276110 A | 9/2003 | | |
| JP | 20046607 A | 1/2004 | | |
| JP | 200551192 A | 2/2005 | | |
| JP | 200571741 A | 3/2005 | | |
| JP | 2007-221039 | * 2/2006 | ........... | H01L 21/312 |
| JP | 2007221039 A | 8/2007 | | |
| JP | 2007254651 A | 10/2007 | | |
| JP | 4139446 B2 | 8/2008 | | |
| JP | 2008263022 A | 10/2008 | | |
| JP | 2011111635 A | 6/2011 | | |

OTHER PUBLICATIONS

Communication dated Jan. 27, 2016, issued by the Taiwanese Patent Office in Taiwanese Patent Application No. 101132115.
Communication dated Aug. 26, 2015 by the Taiwan Intellectual Property Office in related Application No. 101132115.
International Search Report, dated Oct. 2, 2012, issued by the International Searching Authority in counterpart International Application No. PCT/JP2012/071487.
Office Action dated Mar. 18, 2015, issued by the State Intellectual Property Office of P.R. China in Chinese Application No. 201280043228.8.
Supplemental European Search Report dated Jul. 17, 2015, issued by the European Patent Office in European Patent Application No. 12830676.8.
Written Opinion, dated for Oct. 2, 2012, issued by the International Searching Authority in counterpart International Application No. PCT/JP2012/071487.
Communication dated Mar. 26, 2015 issued by the European Patent Office in corresponding Application No. 12830676.8.
Communication from the State Intellectual Property Office of P.R. China dated Nov. 25, 2015 in a Chinese application No. 201280043228.8.
Communication dated Apr. 13, 2016, issued by the State Intellectual Property Office of the People's Republic of China in Chinese Patent Application No. 201280043228.8.
Communication dated Apr. 26, 2016, issued by the Japanese Patent Office in Japanese Patent Application No. 2012-176433.
Communication dated Sep. 13, 2016 issued by the State Intellectual Property Office of P.R. China in counterpart Chinese Patent Application No. 201280043228.8.
Communication dated Jul. 10, 2017, from the European Patent Office in corresponding European Application No. 12830676.8.

* cited by examiner

Primary Examiner — Pancham Bakshi
(74) Attorney, Agent, or Firm — Sughrue Mion, PLLC (57) ABSTRACT

The present invention relates to a film composed of a carbon-containing silicon oxide formed by CVD using, as the raw material, an organosilicon compound having a secondary hydrocarbon group directly bonded to at least one silicon atom and having an atomic ratio of 0.5 or less oxygen atom with respect to 1 silicon atom, which is used as a sealing film for a gas barrier equipment and materials, an FPD device, a semiconductor device and the like.

8 Claims, 3 Drawing Sheets

FILM DEPOSITION MATERIAL, SEALING FILM USING THE SAME AND USE THEREOF

CROSS-REFERENCE TO RELATED APPLICATIONS

The present application is a Continuation of U.S. patent application Ser. No. 14/342,834, filed Mar. 5, 2014, which is a National Stage Application of PCT/JP2012/071487, filed on Aug. 24, 2012, which claims the benefit of Japanese Patent Application No. 2011-192741 filed Sep. 5, 2011. The entire disclosures of the prior applications are hereby incorporated by reference.

TECHNICAL FIELD

The present invention relates to a film deposition material, a sealing film using the same, and use thereof. More specifically, the present invention relates to a sealing film composed of a carbon-containing silicon oxide film obtained through deposition by a chemical vapor deposition method (CVD: Chemical Vapor Deposition) using, as the raw material, a hydrocarbon-substituted silicon compound having a specific structure.

BACKGROUND ART

In a flat-panel display (hereinafter, referred to as FPD) represented by a liquid crystal display and an organic EL display, a glass substrate is used as the base material of its display panel, but in view of thickness reduction, weight reduction, enhancement of impact resistance and flexibility as well as adaptability to a roll-to-roll process, the demand for replacement by a transparent plastic film is increasing. Also, attempts are being made to form an organic transistor on a plastic substrate by using an organic semiconductor or to form LSI, an Si thin-film solar cell, an organic dye-sensitized solar cell, an organic semiconductor solar cell and the like.

Usually, in the case of forming the above-described device on a commercially available plastic substrate, the device or device formed, such as liquid crystal device, organic EL device, TFT device, semiconductor device and solar cell, is weak to water and/or oxygen and therefore, a dark spot or a dot dropout may be generated during displaying on the display, or a semiconductor device, a solar cell and the like may be prevented from fulfilling their function and cannot withstand the practical use. Accordingly, a gas barrier plastic substrate with a gas barrier performance against water vapor and/or oxygen gas is required. On the other hand, instead of an opaque aluminum foil laminate film, a transparent plastic film provided with a gas barrier performance is hereafter more and more expanding its use in the application as a packaging material for food, medicines, electronic materials, electronic components and the like.

The method for providing a transparent gas barrier performance to a transparent plastic substrate or a transparent plastic film includes a physical film deposition method and a CVD method. Patent Document 1 has proposed a barrier bag film where a gas barrier layer is formed by a plasma enhanced chemical vapor deposition method (PECVD; Plasma Enhanced Chemical Vapor Deposition) using, as the raw material, a mixed gas of hexamethyldisiloxane, 1,1,3, 3-tetramethyldisiloxane and/or 1,3-divinyl-1,1,3,3-tetramethyldisiloxane, oxygen, and an inert gas such as helium and argon, but the gas barrier performance thereof is as low as $H_2O=0.2$ to $0.6$ g/m²·day and $O_2=0.4$ to $0.5$ cc/m²·day.

In Patent Documents 2 and 3, the present inventors have proposed a method for forming a low-dielectric insulating film by PECVD using silane and siloxane compounds each having a structure where a secondary or tertiary hydrocarbon group is directly bonded to a silicon atom. However, these methods are a method for forming a low-density thin film, and the thin film formed is not a high-density thin film suitable for a sealing material, particularly, for a gas barrier material.

BACKGROUND ART DOCUMENT

Patent Document

Patent Document 1: Japanese Patent No. 4,139,446
Patent Document 2: JP-A-2004-6607 (the term "JP-A" as used herein means an "unexamined published Japanese patent application")
Patent Document 3: JP-A-2005-51192

SUMMARY OF INVENTION

Problem that Invention is to Solve

The present invention has been made by taking into account those problems, and an object of the present invention to provide a sealing film composed of a carbon-containing silicon oxide film obtained by CVD using, as the raw material, a hydrocarbon-substituted silicon compound having a specific structure, and a gas barrier equipment and materials, an FPD device and a semiconductor device each containing the film.

Means for Solving Problem

The present inventors have found that a silicon compound having a specific silicon to oxygen ratio and containing a hydrocarbon substituent having a specific structure is suitable as a film deposition material for CVD and a film obtained by CVD using, as the raw material, this silicon compound having a specific structure and a specific compositional ratio is useful as a sealing film. The present invention has been accomplished based on this finding.

That is, the present invention is a film deposition material for CVD, containing an organosilicon compound having a secondary hydrocarbon group directly bonded to at least one silicon atom and having an atomic ratio of 0.5 or less oxygen atom with respect to 1 silicon atom. Also, the present invention is a sealing film deposited by CVD using the film deposition material above. Also, the present invention is a sealing film obtained by further subjecting the sealing film above to a heat treatment, an ultraviolet irradiation treatment or an electron beam treatment. Also, the present invention is a gas barrier equipment and materials characterized by using such a sealing film as a gas barrier layer. Also, the present invention is a flat-panel display device or a semiconductor device, characterized by containing such a sealing film.

More specifically, the gist of the present invention resides in the following (1) to (15).

(1) A film deposition material for a chemical vapor deposition method, comprising:
an organosilicon compound having a secondary hydrocarbon group directly bonded to at least one silicon atom and having an atomic ratio of 0.5 or less oxygen atom with respect to 1 silicon atom.

(2) The film deposition material as described in (1) above, wherein the organosilicon compound having a secondary hydrocarbon group directly bonded to at least one silicon atom and having an atomic ratio of 0.5 or less oxygen atom with respect to 1 silicon atom is preferably a disiloxane compound represented by the following formula (1):

[Chem. 1]

(1)

(wherein each of $R^1$ and $R^2$ represents a hydrocarbon group having a carbon number of 1 to 20; $R^1$ and $R^2$ may bond with each other to form a cyclic structure; and each of $R^3$ and $R^4$ represents a hydrocarbon group having a carbon number of 1 to 20 or a hydrogen atom).

(3) The film deposition material as described in (1) above, wherein the organosilicon compound having a secondary hydrocarbon group directly bonded to at least one silicon atom and having an atomic ratio of 0.5 or less oxygen atom with respect to 1 silicon atom is preferably a silane compound represented by the following formula (2):

[Chem. 2]

(2)

(wherein each of $R^5$ and $R^6$ represents a hydrocarbon group having a carbon number of 1 to 20; $R^5$ and $R^6$ may bond with each other to form a cyclic structure; each of $R^7$, $R^8$ and $R^9$ represents a hydrocarbon group having a carbon number of 1 to 20 or a hydrogen atom; and m represents an integer of 1 to 20).

(4) The film deposition material as described in (1) above, wherein the organosilicon compound having a secondary hydrocarbon group directly bonded to at least one silicon atom and having an atomic ratio of 0.5 or less oxygen atom with respect to 1 silicon atom is preferably a cyclic silane compound represented by the following formula (3):

[Chem. 3]

(3)

(wherein each of $R^{10}$ and $R^{11}$ represents a hydrocarbon group having a carbon number of 1 to 20; $R^{10}$ and $R^{11}$ may bond with each other to form a cyclic structure; $R^{12}$ represents a hydrocarbon group having a carbon number of 1 to 20 or a hydrogen atom; and n represents an integer of 4 to 40).

(5) The film deposition material according to any one of (2) to (4) above,
wherein in formula (1), (2) or (3), preferably, both $R^1$ and $R^2$, both $R^5$ and $R^6$ or both $R^{10}$ and $R^{11}$ are methyl or are methyl and ethyl, respectively.

(6) The film deposition material as described in (2) or (5) above,
wherein the organosilicon compound is preferably 1,3-diisopropyldisiloxane, 1,3-diisopropyl-1,3-dimethyldisiloxane, 1,3-diisopropyl-1,1,3,3-tetramethyldisiloxane, 1,3-di-sec-butyldisiloxane, 1,3-di-sec-butyl-1,3-dimethyldisiloxane or 1,3-di-sec-butyl-1,1,3,3-tetramethyldisiloxane.

(7) The film deposition material as described in (3) or (5) above,
wherein the organosilicon compound is preferably isopropylsilane, isopropylmethylsilane, isopropyldimethylsilane, diisopropylsilane, diisopropylmethylsilane, triisopropylsilane, sec-butylsilane, sec-butylmethylsilane, sec-butyldimethylsilane, di-sec-butylsilane, di-sec-butylmethylsilane or tri-sec-butylsilane.

(8) The film deposition material as described in (4) or (5) above,
wherein the organosilicon compound is preferably 1,2,3,4-tetraisopropylcyclotetrasilane, 1,2,3,4,5-pentaisopropylcyclopentasilane, 1,2,3,4,5,6-hexaisopropylcyclohexasilane, 1,1,2,2,3,3,4,4-octaisopropylcyclotetrasilane, 1,1,2,2,3,3,4,4,5,5-decaisopropylcyclopentasilane or 1,1,2,2,3,3,4,4,5,5,6,6-undecaisopropylcyclohexasilane.

(9) The film deposition material as described in any one of (1) to (8) above,
wherein the chemical vapor deposition method is preferably a plasma enhanced chemical vapor deposition method.

(10) The film deposition material as described in any one of (1) to (8) above,
wherein the chemical vapor deposition method is preferably a catalytic chemical vapor deposition method.

(11) A sealing film, deposited by a chemical vapor deposition method using the film deposition material described in any one of (1) to (10) above.

(12) A sealing film, obtained by preferably further subjecting the sealing film described in (11) above to a heat treatment, an ultraviolet irradiation treatment or an electron beam treatment.

(13) A gas barrier equipment and materials, using the sealing film described in (11) or (12) above as a gas barrier layer.

(14) A flat-panel display device, containing:
the sealing film described in (11) or (12) above.

(15) A semiconductor device, comprising:
the sealing film described in (11) or (12) above.

ADVANTAGE OF THE INVENTION

According to the present invention, a film deposition material containing an organosilicon compound having a secondary hydrocarbon group directly bonded to at least one silicon atom and having an atomic ratio of 0.5 or less oxygen atom with respect to 1 silicon atom can be deposited by CVD to form a carbon-containing silicon oxide film, and the film can be used as a sealing film. Above all, this sealing film is very useful as a gas barrier film or a gas barrier layer for a gas barrier substrate.

MODE FOR CARRYING OUT THE INVENTION

The present invention is described in detail below.

In the present invention, the organosilicon compound having a secondary hydrocarbon group directly bonded to at least one silicon atom and having an atomic ratio of 0.5 or less oxygen atom with respect to 1 silicon atom is not particularly limited but is preferably a disiloxane compound represented by the following formula (1):

[Chem. 4]

(1)

(wherein each of $R^1$ and $R^2$ represents a hydrocarbon group having a carbon number of 1 to 20, $R^1$ and $R^2$ may bond with each other to form a cyclic structure, and each of $R^3$ and $R^4$ represents a hydrocarbon group having a carbon number of 1 to 20 or a hydrogen atom), a silane compound represented by the following formula (2):

[Chem. 5]

(2)

(wherein each of $R^5$ and $R^6$ represents a hydrocarbon group having a carbon number of 1 to 20, $R^5$ and $R^6$ may bond with each other to form a cyclic structure, each of $R^7$, $R^8$ and $R^9$ represents a hydrocarbon group having a carbon number of 1 to 20 or a hydrogen atom, and m represents an integer of 1 to 20), or a cyclic silane compound represented by the following formula (3):

[Chem. 6]

(3)

(wherein each of $R^{10}$ and $R^{11}$ represents a hydrocarbon group having a carbon number of 1 to 20, $R^{10}$ and $R^{11}$ may bond with each other to form a cyclic structure, $R^{12}$ represents a hydrocarbon group having a carbon number of 1 to 20 or a hydrogen atom, and n represents an integer of 4 to 40).

Each of $R^1$ and $R^2$ in formula (1), each of $R^5$ and $R^6$ in formula (2), or each of $R^{10}$ and $R^{11}$ in formula (3) is a saturated or unsaturated hydrocarbon group having a carbon number of 1 to 20 and may have any of linear, branched and cyclic structures. In addition, compounds to which they are linked together to form a cyclic structure are also included within the scope of the present invention. If the carbon number exceeds 20, procurement of the raw material such as corresponding organic halide may be difficult and even if the raw material can be procured, its purity may be low. Considering stable use of the CVD apparatus, a hydrocarbon group having a carbon number of 1 to 10 is particularly preferred, because the organosilicon compound can be kept from excessive reduction in its vapor pressure.

Examples of the hydrocarbon group of $R^1$ and $R^2$ in formula (1), $R^5$ and $R^6$ in formula (2), or $R^{10}$ and $R^{11}$ in formula (3) include, but are not particularly limited to, an alkyl group having a carbon number of 1 to 20, preferably a carbon number of 1 to 10, an aryl group, an arylalkyl group, an alkylaryl group, and an alkenyl group such as vinyl group. $R^1$ and $R^2$, $R^5$ and $R^6$, or $R^{10}$ and $R^{11}$ may be the same as or different from one another.

Examples of the case where $R^1$ and $R^2$, $R^5$ and $R^6$, or $R^{10}$ and $R^{11}$ are not bonded together include compounds where each of $R^1$ and $R^2$, each of $R^5$ and $R^6$, or each of $R^{10}$ and $R^{11}$ is methyl, ethyl, n-propyl, isopropyl, n-butyl, i-butyl, sec-butyl, tert-butyl, n-pentyl, tert-amyl, n-hexyl, cyclohexyl, phenyl, benzyl or toluoyl.

As for examples of the group formed by combining together $R^1$ and $R^2$, $R^5$ and $R^6$, or $R^{10}$ and $R^{11}$ and bonded to Si through a secondary hydrocarbon group, representative examples include a case where the secondary hydrocarbon group is cyclobutyl, cyclobutenyl, cyclopentyl, cyclopentadienyl, cyclohexyl, cyclohexenyl, cyclooctenyl or cyclooctadienyl.

Among others, as for the combination of $R^1$ and $R^2$, $R^5$ and $R^6$, or $R^{10}$ and $R^{11}$, isopropyl when both $R^1$ and $R^2$, both $R^5$ and $R^6$, or both $R^{10}$ and $R^{11}$ are methyl; sec-butyl when $R^1$ and $R^2$, $R^5$ and $R^6$, or $R^{10}$ and $R^{11}$ are methyl and ethyl, respectively; and cyclopentyl, cyclopentadienyl, cyclohexyl or cyclohexenyl group when $R^1$ and $R^2$, $R^5$ and $R^6$, or $R^{10}$ and $R^{11}$ are bonded together, are preferred from the economical standpoint, and in this case, the gas barrier performance may be greatly enhanced.

Each of $R^3$ and $R^4$ in formula (1), each of $R^7$, $R^8$ and $R^9$ in formula (2), or $R^{12}$ in formula (3) represents a hydrocarbon group having a carbon number of 1 to 20 or a hydrogen atom, and the hydrocarbon group is a saturated or unsaturated hydrocarbon group and may have any of linear, branched and cyclic structures. If the carbon number exceeds 20, the vapor pressure of the organosilicon compound produced may be disadvantageously reduced to make use in a CVD apparatus difficult.

As for the hydrocarbon group of $R^3$ and $R^4$ in formula (1), $R^7$, $R^8$ and $R^9$ in formula (2), or $R^{12}$ in formula (3), the same groups as examples of the hydrocarbon group of $R^1$ and $R^2$ in formula (1), $R^5$ and $R^6$ in formula (2), or $R^{10}$ and $R^{11}$ in formula (3) may be used.

In particular, when each of $R^3$ and $R^4$ in formula (1), each of $R^7$, $R^8$ and $R^9$ in formula (2), or $R^{12}$ in formula (3) is a hydrogen atom or a hydrocarbon group having a carbon number of 1 to 4, i.e., methyl, ethyl, n-propyl, isopropyl, n-butyl, i-butyl, sec-butyl or tert-butyl, this is preferred in view of high vapor pressure and procurement of raw material. Above all, when each of those members is a hydrogen atom or a secondary or tertiary carbon substituent, i.e., isopropyl, sec-butyl or tert-butyl, the gas barrier performance may be greatly enhanced.

Among disiloxane compounds represented by formula (1), a disiloxane compound having a hydrogen atom directly bonded to a silicon atom, represented by the following formula (4):

[Chem. 7]

(4)

(wherein each of $R^1$ and $R^2$ represents a hydrocarbon group having a carbon number of 1 to 20, $R^1$ and $R^2$ may bond with each other to form a cyclic structure, and $R^3$ represents a hydrocarbon group having a carbon number of 1 to 20 or a hydrogen atom), is preferred, and in this case, a sealing film having a very high gas barrier performance may be formed at a high deposition rate.

Specific examples of the disiloxane compound having a structure where a secondary hydrocarbon group is directly bonded to a silicon atom, represented by formula (1) or (4), include 1,3-diisopropyldisiloxane, 1,3-diisopropyl-1,3-dimethyldisiloxane, 1,3-diisopropyl-1,3-diethyldisiloxane, 1,3-diisopropyl-1,3-divinyldisiloxane, 1,3-diisopropyl-1,3-di-n-propyldisiloxane, 1,1,3,3-tetraisopropyldisiloxane, 1,3-diisopropyl-1,3-di-n-butyldisiloxane, 1,3-diisopropyl-1,3- diisobutyldisiloxane, 1,3-diisopropyl-1,3-di-sec-butyldisiloxane, 1,3-diisopropyl-1,3-diphenyldisiloxane, 1,3-diisopropyl-1,1,3,3-tetramethyldisiloxane, 1,3-diisopropyl-1,1,3,3-tetraethyldisiloxane, 1,3-diisopropyl-1,1,3,3-tetravinyldisiloxane, 1,3-diisopropyl-1,1,3,3-tetra-n-propyldisiloxane, 1,3-diisopropyl-1,1,3,3-tetra-n-butyldisiloxane, 1,3-diisopropyl-1,1,3,3-tetraisobutyldisiloxane, 1,3-diisopropyl-1,1,3,3-tetra-sec-butyldisiloxane, 1,3-diisopropyl-1,1,3,3-tetraphenyldisiloxane, 1,1,3,3,-tetraisopropyl-1,3-dimethyldisiloxane, 1,1,3,3-tetraisopropyl-1,3-diethyldisiloxane, 1,1,3,3-tetraisopropyl-1,3-divinyldisiloxane, 1,1,3,3,-tetraisopropyl-1,3- di-n-propyldisiloxane, 1,1,3,3- tetraisopropyl- 1,3-di-n-propyldisiloxane, 1,1,3,3-tetraisopropyl-1,3-di-n-butyldisiloxane, 1,1,3,3- tetraisopropyl-1,3-diisobutyldisiloxane, 1,1,3,3-tetraisopropyl-1,3-di-sec-butyldisiloxane, 1,1,3,3- tetraisopropyl- 1,3-diphenyldisiloxane, 1,1,1,3,3,3- hexaisopropyldisiloxane, 1,3-di-sec-butyldisiloxane, 1,3-di-sec-butyl-1,3-dimethyldisiloxane, 1,3-di-sec-butyl-1,3-diethyldisiloxane, 1,3-di-sec-butyl-1,3-divinyldisiloxane, 1,3-di-sec-butyl-1,3-di-n-propyldisiloxane, 1,1,3,3-tetra-sec-butyldisiloxane, 1,3-di-sec-butyl-1,3-di-n-butyldisiloxane, 1,3-di-sec-butyl-1,3-diisobutyldisiloxane, 1,3-di-sec-butyl-1,3-di-sec-butyldisiloxane, 1,3-di-sec-butyl-1,3-diphenyldisiloxane, 1,3-di-sec-butyl-1,1,3,3-tetramethyldisiloxane, 1,3-di-sec-butyl-1,1,3,3-tetraethyldisiloxane, 1,3-di-sec-butyl-1,1,3,3-tetravinyldisiloxane, 1,3-di-sec-butyl-1,1,3,3-tetra-n-propyldisiloxane, 1,3-di-sec-butyl-1,1,3,3-tetra-n-butyldisiloxane, 1,3- di-sec-butyl-1,1,3,3-tetraisobutyldisiloxane, 1,3- di-sec-butyl-1,1,3,3-tetraphenyldisiloxane, 1,1,3,3,-tetra-sec-butyl-1,3-dimethyldisiloxane, 1,1,3,3-tetra-sec-butyl-1,3-diethyldisiloxane, 1,1,3,3-tetra-sec-butyl-1,3-divinyldisiloxane, 1,1,3,3-tetra-sec-butylisopropyl-1,3-di-n-propyldisiloxane, 1,1,3,3-tetra-sec-butyl-1,3-di-n-propyldisiloxane, 1,1,3,3-tetra-sec-butyl-1,3-di-n-butyldisiloxane, 1,1,3,3-tetra-sec-butyl-1,3-diisobutyldisiloxane, 1,1,3,3-tetra-sec-butyl-1,3-diphenyldisiloxane, 1,1,1,3,3,3-hexa-sec-butyldisiloxane, 1,3-dicyclopentyldisiloxane, 1,3-dicyclopentyl-1,3-dimethyldisiloxane, 1,3-dicyclopentyl-1,3-diethyldisiloxane, 1,3-dicyclopentyl-1,3-divinyldisiloxane, 1,3-dicyclopentyl-1,3-di-n-propyldisiloxane, 1,1,3,3-tetracyclopentyldisiloxane, 1,3-dicyclopentyl-1,3-di-n-butyldisiloxane, 1,3-dicyclopentyl-1,3-diisobutyldisiloxane, 1,3-dicyclopentyl-1,3-di-sec-butyldisiloxane, 1,3-dicyclopentyl-1,3-diphenyldisiloxane, 1,3-dicyclopentyl-1,1,3,3-tetramethyldisiloxane, 1,3-dicyclopentyl-1,1,3,3-tetraethyldisiloxane, 1,3-dicyclopentyl-1,1,3,3-tetravinyldisiloxane, 1,3-dicyclopentyl-1,1,3,3-tetra-n-propyldisiloxane, 1,3-dicyclopentyl-1,1,3,3-tetra-n-butyldisiloxane, 1,3-dicyclopentyl-1,1,3,3-tetraisobutyldisiloxane, 1,3-dicyclopentyl-1,1,3,3-tetra-sec-butyldisiloxane, 1,3- dicyclopentyl-1,1,3,3-tetraphenyldisiloxane, 1,1,3,3-tetracyclopentyl-1,3-dimethyldisiloxane, 1,1,3,3-tetracyclopentyl-1,3-diethyldisiloxane, 1,1,3,3-tetracyclopentyl-1,3-divinyldisiloxane, 1,1,3,3-tetracyclopentyl-1,3-di-n-propyldisiloxane, 1,1,3,3- tetracyclopentyl-1,3-di-n-propyldisiloxane, 1,1,3,3- tetracyclopentyl-1,3-di-n-butyldisiloxane, 1,1,3,3-tetracyclopentyl-1,3-diisobutyldisiloxane, 1,1,3,3-tetracyclopentyl-1,3-di-sec-butyldisiloxane, 1,1,3,3-tetracyclopentyl-1,3-diphenyldisiloxane, 1, 1,1,3,3,3-hexacyclopentyldisiloxane, 1,3-dicyclopentadienyldisiloxane, 1,3-dicyclopentadienyl-1,3-dimethyldisiloxane, 1,3-dicyclopentadienyl-1,3-diethyldisiloxane, 1,3-dicyclopentadienyl-1,3-divinyldisiloxane, 1,3- dicyclopentadienyl-1,3-di-n-propyldisiloxane, 1,1,3,3-tetracyclopentadienyldisiloxane, 1,3- dicyclopentadienyl-1,3-di-n-butyldisiloxane, 1,3-dicyclopentadienyl-1,3-diisobutyldisiloxane, 1,3-dicyclopentadienyl-1,3-di-sec-butyldisiloxane, 1,3- dicyclopentadienyl-1,3-diphenyldisiloxane, 1,3-dicyclopentadienyl-1,1,3,3-tetramethyldisiloxane, 1,3-dicyclopentadienyl-1,1,3,3-tetraethyldisiloxane, 1,3-dicyclopentadienyl-1,1,3,3-tetravinyldisiloxane, 1,3-dicyclopentadienyl-1,1,3,3-tetra-n-propyldisiloxane, 1,3-dicyclopentadienyl-1,1,3,3-tetra-n-butyldisiloxane, 1,3-dicyclopentadienyl-1,1,3,3-tetraisobutyldisiloxane, 1,3-dicyclopentadienyl-1,1,3,3-tetra-sec-butyldisiloxane, 1,3-dicyclopentadienyl-1,1,3,3-tetraphenyldisiloxane, 1,1,3,3-tetracyclopentadienyl-1,3-dimethyldisiloxane, 1,1,3,3-tetracyclopentadienyl-1,3-diethyldisiloxane, 1,1,3, 3-tetracyclopentadienyl-1,3-divinyldisiloxane, 1,1,3,3-tetracyclopentadienyl-1,3-di-n-propyldisiloxane, 1,1,3,3-tetracyclopentadienyl-1,3-di-n-propyldisiloxane, 1,1,3,3-tetracyclopentadienyl-1,3-di-n-butyldisiloxane, 1,1,3,3-tetracyclopentadienyl-1,3-diiosobutyldisiloxane, 1,1,3,3- tetracyclopentadienyl-1,3-di-sec-butyldisiloxane, 1,1,3,3-tetracyclopentadienyl-1,3-diphenyldisiloxane, 1,1,1,3,3,3-hexacyclopentadienyldisiloxane, 1,3-dicyclohexyldisiloxane, 1,3-dicyclohexyl-1,3-dimethyldisiloxane, 1,3-dicyclohexyl-1,3-diethyldisiloxane, 1,3-dicyclohexyl-1,3-divinyldisiloxane, 1,3-dicyclohexyl-1,3-di-n-propyldisiloxane, 1,1,3,3-tetracyclohexyldisiloxane, 1,3-dicyclohexyl-1,3-di-n-butyldisiloxane, 1,3-dicyclohexyl-1,3-diisobutyldisiloxane, 1,3-dicyclohexyl-1,3-di-sec-butyldisiloxane, 1,3-dicyclohexyl-1,3-diphenyldisiloxane, 1,3-dicyclohexyl-1,1,3,3- tetramethyldisiloxane, 1,3-dicyclohexyl-1,1,3,3-tetraethyldisiloxane, 1,3-dicyclohexyl-1,1,3,3-tetravinyldisiloxane, 1,3- dicyclohexyl-1,1,3,3-tetra-n-propyldisiloxane, 1,3- dicyclohexyl-1,1,3,3-tetra-n-butyldisiloxane, 1,3-dicyclohexyl-1,1,3,3-tetraisobutyldisiloxane, 1,3-dicyclohexyl-1,1,3,3-tetra-sec-butyldisiloxane, 1,3- dicyclohexyl-1,1,3,3-tetraphenyldisiloxane,

1,1,3,3-tetracyclohexyl-1,3- dimethyldisiloxane, 1,1,3,3-tetracyclohexyl-1,3-diethyldisiloxane, 1,1,3,3-tetracyclohexyl-1,3-divinyldisiloxane, 1,1,3,3-tetracyclohexyl-1,3-di-n-propyldisiloxane, 1,1,3,3-tetracyclohexyl-1,3-di-n-propyldisiloxane, 1,1,3,3-tetracyclohexyl-1,3-di-n-butyldisiloxane, 1,1,3,3-tetracyclohexyl-1,3-diisobutyldisiloxane, 1,1,3,3-tetracyclohexyl-1,3-di-sec-butyldisiloxane, 1,1,3,3-tetracyclohexyl-1,3-diphenyldisiloxane, and 1,1,1,3,3,3-hexacyclohexyldisiloxane.

Among others, 1,3-diisopropyldisiloxane, 1,3-diisopropyl-1,3-dimethyldisiloxane, 1,3-diisopropyl-1,1,3,3-tetramethyldisiloxane, 1,3-di-sec-butyldisiloxane, 1,3-di-sec-butyl-1,3-dimethyldisiloxane, 1,3-di-sec-butyl-1,1,3,3-tetramethyldisiloxane and the like are preferred.

The disiloxane compound having a structure where a secondary hydrocarbon group is directly bonded to a silicon atom, represented by formula (1) or (4), is not particularly limited in its production method but can be produced from a hydrolyzable organosilane compound.

For example, an organic compound represented by the following formula (5):

[Chem. 8]

(5)

(wherein $R^1$ and $R^2$ are the same as respective members in formula (1) or (4), and X represents a hydrogen atom, a chlorine atom, a bromine atom or an iodine atom) is reacted with an organolithium or metal lithium particle to produce a compound where a secondary hydrocarbon group and/or an alkenyl group are directly bonded to a lithium atom, and the produced compound is reacted with halogenated alkoxysilanes represented by the following formula (6):

[Chem. 9]

(6)

(wherein Y represents a fluorine atom, a chlorine atom, a bromine atom or an iodine atom, $R^3$ and $R^4$ are the same as respective members in formula (1) or (4), $R^{13}$ represents a hydrocarbon group having a carbon number of 1 to 20 or a hydrogen atom, and p represents an integer of 0 to 2) to produce a hydrolyzable organosilane compound represented by the following formula (7):

[Chem. 10]

(7)

(wherein $R^1$, $R^2$, $R^3$ and $R^4$ are the same as respective members in formula (1) or (4), Y and $R^{13}$ are the same as those in formula (6), and q represents an integer of 0 or 1).

A hydrolyzable organosilane compound represented by formula (7) can be produced also by using a metal magnesium in place of the organolithium or metal lithium particle in the above-described production method for a hydrolyzable organosilane compound.

Out of organic compounds represented by formula (5), examples of the compound where X is a chlorine atom, a bromine atom or an iodine atom include isopropyl chloride, isopropyl bromide, isopropyl iodide, sec-butyl chloride, sec-butyl bromide, sec-butyl iodide, cyclopentyl chloride, cyclopentyl bromide, cyclopentyl iodide, cyclohexyl chloride, cyclohexyl bromide, and cyclohexyl iodide.

Out of organic compounds represented by formula (5), examples of the compound where X is a hydrogen atom include cyclopentadiene, pentamethylcyclopentadiene, and 1,2,3,4-tetramethyl-1,3-cyclopentadiene, and by reacting such a compound with an organolithium such as n-butyllithium and tert-butyllithium, a compound where a secondary hydrocarbon group and/or an alkenyl group are directly bonded to a lithium atom can be produced.

Examples of the halogenated alkoxysilanes represented by formula (6) include dichlorosilane, dibromosilane, diiodosilane, dimethoxysilane, diethoxysilane, methyldichlorosilane, methyldibromosilane, methyldiiodosilane, methyldimethoxysilane, methyldiethoxysilane, ethyldichlorosilane, ethyldibromosilane, ethyldiiodosilane, ethyldimethoxysilane, ethyldiethoxysilane, n-propyldichlorosilane, n-propyldibromosilane, n-propyldiiodosilane, n-propyldimethoxysilane, n-propyldiethoxysilane, isopropyldichlorosilane, isopropyldibromosilane, isopropyldiiodosilane, isopropyldimethoxysilane, isopropyldiethoxysilane, n-butyldichlorosilane, n-butyldibromosilane, n-butyldiiodosilane, n-butyldimethoxysilane, n-butyldiethoxysilane, isobutyldichlorosilane, isobutyldibromosilane, isobutyldiiodosilane, isobutyldimethoxysilane, isobutyldiethoxysilane, sec-butyldichlorosilane, sec-butyldibromosilane, sec-butyldiiodosilane, sec-butyldimethoxysilane, sec-butyldiethoxysilane, tert-butyldichlorosilane, tert-butyldibromosilane, tert-butyldiiodosilane, tert-butyldimethoxysilane, and tert-butyldiethoxysilane.

Other examples include dimethyldichlorosilane, dimethyldibromosilane, dimethyldiiodosilane, dimethyldimethoxysilane, dimethyldiethoxysilane, diethyldichlorosilane, diethyldibromosilane, diethyldiiodosilane, diethyldimethoxysilane, diethyldiethoxysilane, di-n-propyldichlorosilane, di-n-propyldibromosilane, di-n-propyldiiodosilane, di-n-propyldimethoxysilane, di-n-propyldiethoxysilane, diisopropyldichlorosilane, diisopropyldibromosilane, diisopropyldiiodosilane, diisopropyldimethoxysilane, diisopropyldiethoxysilane, di-n-butyldichlorosilane, di-n-butyldibromosilane, di-n-butyldiiodosilane, di-n-butyldimethoxysilane, di-n-butyldiethoxysilane, diisobutyldichlorosilane, diisobutyldibromosilane, diisobutyldiiodosilane, diisobutyldimethoxysilane, diisobutyldiethoxysilane, di-sec-butyldichlorosilane, sec-butyldibromosilane, di-sec-butyldiiodosilane, di-sec-butyldimethoxysilane, di-sec-butyldiethoxysilane, di-tert-butyldichlorosilane, di-tert-butyldibromosilane, di-tert-butyldiiodosilane, di-tert-butyldimethoxysilane, di-tert-butyldiethoxysilane, divinyldichlorosilane, diphenyldichlorosilane, and diphenyldimethoxysilane.

By employing this production method, a hydrolyzable organosilane compound represented by formula (7) can be obtained in high yield and high purity while suppressing the production of byproducts.

The production conditions for the compound where a secondary hydrocarbon group is directly bonded to a lithium atom are not particularly limited but are described below by referring to one example.

As the metal lithium used, a lithium wire, a lithium ribbon, a lithium shot and the like may be employed, but in view of reaction efficiency, it is preferred to use a lithium fine particle having a particle diameter of 500 μm or less.

In the case of using a metal magnesium, a magnesium ribbon, a magnesium particle, a magnesium powder and the like may be employed.

As the organolithium used, an n-hexane solution of n-butyllithium, an n-pentane solution of tert-butyllithium, and the like may be employed.

The solvent used for the reaction is not particularly limited as long as it is a solvent used in this technical field, and for example, saturated hydrocarbons such as n-pentane, i-pentane, n-hexane, cyclohexane, n-heptane and n-decane, unsaturated hydrocarbons such as toluene, xylene and decene-1, and ethers such as diethyl ether, dipropyl ether, tert-butyl methyl ether, dibutyl ether and cyclopentyl methyl ether, may be used. Furthermore, a mixed solvent thereof may also be used.

As for the reaction temperature, the reaction above is preferably performed in a temperature range not involving decomposition of the produced compound where a secondary carbon atom is bonded to a lithium atom or where a secondary hydrocarbon group is directly bonded to a magnesium atom. Usually, the reaction is preferably performed at −100 to 200° C. that is a temperature employed in industry, more preferably at −85 to 150° C. The reaction pressure condition may be any of under pressure, under atmospheric pressure and under reduced pressure.

The synthesized compound where a secondary hydrocarbon group is directly bonded to a lithium atom or where a secondary hydrocarbon group is directly bonded to a magnesium atom, may be used as it is after the production or may be used after removing unreacted organic halide, metal lithium or metal magnesium and removing lithium halide or magnesium halide which are a reaction byproduct.

The conditions for reacting the thus-obtained compound where a secondary hydrocarbon group is directly bonded to a lithium atom or where a secondary hydrocarbon group is directly bonded to a magnesium atom, with halogenated alkoxysilanes of formula (7) are not particularly limited and are described below by referring to one example.

The usable reaction solvents are the same as those which can be used in the reaction for the compound where a secondary hydrocarbon group is directly bonded to a lithium atom (or a magnesium atom). As for the reaction temperature, the reaction is preferably preformed in a temperature range not involving decomposition of the compound where a secondary hydrocarbon group is directly bonded to a lithium atom or where a secondary hydrocarbon group is directly bonded to a magnesium atom. Usually, the reaction is preferably performed at −100 to 200° C. that is a temperature employed in industry, more preferably at −85 to 150° C. The reaction pressure condition may be any of under pressure, under atmospheric pressure and under reduced pressure.

The production method for the disiloxane compound of formula (1) or (4) is not particularly limited, but the compound can be produced by reacting the hydrolyzable organosilane compound of formula (7) with water in the presence of an acid or a base.

As the acid caused to be present together in the reaction, an inorganic acid such as hydrochloric acid, nitric acid and sulfuric acid, and an organic acid such as toluenesulfonic acid, may be used.

The reaction solvent usable for producing the disiloxane compound of formula (1) or (4) is not particularly limited as long as it is a solvent used in this technical field, and, for example, saturated hydrocarbons such as n-pentane, i-pentane, n-hexane, cyclohexane, n-heptane and n-decane, unsaturated hydrocarbons such as toluene, xylene and decene-1, ethers such as diethyl ether, dipropyl ether, tert-butyl methyl ether, dibutyl ether, cyclopentyl methyl ether and tetrahydrofuran, and alcohols such as methanol, ethanol, isopropanol, n-butanol, tert-butanol and 2-ethylhexanol, may be used. Furthermore, a mixed solvent thereof may also be employed. In addition, the compound may also be produced only from the hydrolyzable organosilane compound itself of formula (7) without using a solvent.

As for the reaction temperature when producing the disiloxane compound of formula (1) or (4), usually, the reaction is preferably performed at −100 to 200° C. that is a temperature employed in industry, more preferably at −85 to 150° C. The reaction pressure condition may be any of under pressure, under atmospheric pressure and under reduced pressure.

As to the method for purifying the synthesized disiloxane compound of formula (1) or (4), in order to ensure a useful water content in use as a film deposition material and at the same time, reduce the amount of impurity elements derived from the production raw materials, except for silicon, carbon, oxygen and hydrogen, the by-produced lithium salt or magnesium salt may be removed by a purification technique, for example, by filtration using a glass filter, a sintered porous body or the like, by distillation under atmospheric pressure or reduced pressure, or by column separation using silica, alumina or a polymer gel. At this time, these techniques may be used in combination, if desired.

Also, when a silanol structure-containing by-product is contained, the hydrocarbon-substituted alkoxysilane as the main product can be isolated/produced by distillation after the hydroxyl group of silanol is precipitated as a sodium salt or a potassium salt with sodium hydride, potassium hydride or the like.

At the production, the purification conforms to the method in the field of organic metal compound synthesis. That is, it is preferred to perform the purification in a dehydrated and deoxidized nitrogen or argon atmosphere and previously subject the employed solvent, column packing material for purification, and the like to a dehydration operation. Furthermore, impurities such as metal residue and particles are preferably removed in advance.

Specific examples of the silane compound represented by formula (2) include monosilanes such as isopropylsilane, isopropylmethylsilane, isopropylethylsilane, isopropyl-n-propylsilane, isopropyl-n-butylsilane, isopropylisobutylsilane, isopropyl-sec-butylsilane, isopropyl-sec-butylsilane, isopropyl-n-hexylsilane, isopropylcyclohexylsilane, isopropylcyclopentylsilane, isopropylcyclopentadienylsilane, isopropylphenylsilane, isopropyldimethylsilane, isopropyldiethylsilane, isopropyldiethylsilane, isopropyl-di-n-propylsilane, isopropyl-di-n-butylsilane, isopropyldiisobutylsilane, isopropyl-di-sec-butylsilane, isopropyl-di-n-hexylsilane, isopropyldicyclohexylsilane, isopropyldicyclopentylsilane, isopropyldicyclopentadienylsilane, isopropyldiphenylsilane, diisopropylsilane, diisopropylmethylsilane, diisopropylethylsilane, diisopropyl-n-propylsilane, diisopropyl-n-butylsilane, diisopropyl-sec-butylsilane, diisopropyl-sec-butylsilane, diisopropyl-n-hexylsilane, diisopropylcyclohexylsilane, diisopropylcyclopentylsilane, diisopropylcyclopentadienylsilane, diisopropylphenylsilane, triisopropylsilane, triisopropylmethylsilane, triisopropylethylsilane, triisopropyl-n-propylsilane, triisopropyl-n-butylsilane, triisopropylisobutylsilane, triisopropyl-sec-butylsilane, triisopropyl-n-hexylsilane, triisopropylcyclohexylsilane, triisopropyl cyclopentylsilane, triisopropylcyclopentadienylsilane, triisopropylphenylsilane, tetraisopropylsilane, sec-butylsilane, sec-butylmethylsilane, sec-butylethylsilane, sec-butyl-n-propylsilane, sec-butyl-n-butylsilane, sec-butylisobutylsilane, sec-butyl-sec-butylsilane, sec-butyl-sec-butylsilane, sec-butyl-n-hexylsilane, sec-butylcyclohexylsilane, sec-butylcyclopentylsilane, sec-butylcyclopentadienylsilane, sec-butylphenylsilane, sec-butyldimethylsilane, sec-butyldiethylsilane, sec-butyldiethylsilane, sec-butyl-di-n-propylsilane, sec-butyl-di-n-butylsilane, sec-butyldiisobutylsilane, sec-butyl-di-sec-butylsilane, sec-butyl-di-n-hexylsilane, sec-butyldicyclohexylsilane, sec-butyldicyclopentylsilane, sec-butyldicyclopentadienylsilane, sec-butyldiphenylsilane, di-sec-butylsilane, di-sec-butylmethylsilane, di-sec-butylethylsilane, di-sec-butyl-n-propylsilane, di-sec-butyl-n-butylsilane, di-sec-butylisobutylsilane, di-sec-butyl-sec-butylsilane, di-sec-butyl-n-hexylsilane, di-sec-butylcyclohexylsilane, di-sec-butylcyclopentylsilane, di-sec-butylcyclopentadienylsilane, di-sec-butylphenylsilane, tri-sec-butylsilane, tri-sec-butylmethylsilane, tri-sec-butylethylsilane, tri-sec-butyl-n-propylsilane, tri-sec-butyl-n-butylsilane, tri-sec-butylisobutylsilane, tri-sec-butyl-n-hexylsilane, tri-sec-butylcyclohexylsilane, tri-sec-butylcyclopentylsilane, tri-sec-butylcyclopentadienylsilane, tri-sec-butylphenylsilane, tetra-sec-butylsilane, cyclopentylsilane, cyclopentylmethylsilane, cyclopentylethylsilane, cyclopentyl-n-propylsilane, cyclopentyl-n-butylsilane, cyclopentylisobutylsilane, cyclopentyl-sec-butylsilane, cyclopentyl-sec-butylsilane, cyclopentyl-n-hexylsilane, cyclopentylcyclohexylsilane, cyclopentylcyclopentadienylsilane, cyclopentylphenylsilane, cyclopentyldimethylsilane, cyclopentyldiethylsilane, cyclopentyldiethylsilane, cyclopentyl-di-n-propylsilane, cyclopentyl-di-n-butylsilane, cyclopentyldiisobutylsilane, cyclopentyl-di-sec-butylsilane, cyclopentyl-di-n-hexylsilane, cyclopentyldicyclohexylsilane, cyclopentyldicyclopentylsilane, cyclopentyldicyclopentadienylsilane, cyclopentyldiphenylsilane, dicyclopentylsilane, dicyclopentylmethylsilane, dicyclopentylethylsilane, dicyclopentyl-n-propylsilane, dicyclopentyl-n-butylsilane, dicyclopentylisobutylsilane, dicyclopentyl-sec-butylsilane, dicyclopentyl-sec-butylsilane, dicyclopentyl-n-hexylsilane, dicyclopentylcyclohexylsilane, dicyclopentylcyclopentadienylsilane, dicyclopentylphenylsilane, tricyclopentylsilane, tricyclopentylmethylsilane, tricyclopentylethylsilane, tricyclopentyl-n-propylsilane, tricyclopentyl-n-butylsilane, tricyclopentylisobutylsilane, tricyclopentyl-sec-butyl silane, tricyclopentyl-n-hexylsilane, tricyclopentylcyclohexylsilane, tricyclopentylcyclopentadienylsilane, tricyclopentylphenylsilane, tetracyclopentylsilane, cyclopentadienylsilane, cyclopentadienylmethylsilane, cyclopentadienylethylsilane, cyclopentadienyl-n-propylsilane, cyclopentadienyl-n-butylsilane, cyclopentadienylisobutylsilane, cyclopentadienyl-sec-butylsilane, cyclopentadienyl-sec-butylsilane, cyclopentadienyl-n-hexylsilane, cyclopentadienylcyclohexylsilane, cyclopentadienylcyclopentylsilane, cyclopentadienylphenylsilane, cyclopentadienyldimethylsilane, cyclopentadienyldiethylsilane, cyclopentadienyldiethylsilane, cyclopentadienyl-di-n-propylsilane, cyclopentadienyl-di-n-butylsilane, cyclopentadienyldiisobutylsilane, cyclopentadienyl-di-sec-butylsilane, cyclopentadienyl-di-n-hexylsilane, cyclopentadienyldicyclohexylsilane, cyclopentadienyldicyclopentylsilane, cyclopentadienyldiphenylsilane, dicyclopentadienylsilane, dicyclopentadienylmethylsilane, dicyclopentadienylethylsilane, dicyclopentadienyl-n-propylsilane, dicyclopentadienyl-n-butylsilane, dicyclopentadienylisobutylsilane, dicyclopentadienyl-sec-butylsilane, dicyclopentadienyl-sec-butylsilane, dicyclopentadienyl-n-hexylsilane, dicyclopentadienylcyclohexylsilane, dicyclopentadienylcyclopentylsilane, dicyclopentadienylphenylsilane, tricyclopentadienylsilane, tricyclopentadienylmethylsilane, tricyclopentadienylethylsilane, tricyclopentadienyl-n-propylsilane, tricyclopentadienyl-n-butylsilane, tricyclopentadienylisobutylsilane, tricyclopentadienyl-sec-butylsilane, tricyclopentadienyl-n-hexylsilane, tricyclopentadienylcyclohexylsilane, tricyclopentadienylcyclopentylsilane, tricyclopentadienylphenylsilane, tetracyclopentadienylsilane, cyclohexylsilane, cyclohexylmethylsilane, cyclohexylethylsilane, cyclohexyl-n-propylsilane, cyclohexyl-n-butylsilane, cyclohexylisobutylsilane, cyclohexyl-sec-butylsilane, cyclohexyl-sec-butylsilane, cyclohexyl-n-hexylsilane, cyclohexylcyclohexylsilane, cyclohexylcyclopentylsilane, cyclohexylcyclopentadienylsilane, cyclohexylphenylsilane, cyclohexyldimethylsilane, cyclohexyldiethylsilane, cyclohexyldiethylsilane, cyclohexyldi-n-propylsilane, cyclohexyl-di-n-butylsilane, cyclohexyldiisobutylsilane, cyclohexyl-di-sec-butylsilane, cyclohexyl-di-n-hexylsilane, cyclohexyldicyclopentylsilane, cyclohexyldicyclopentadienylsilane, cyclohexyldiphenylsilane, dicyclohexylsilane, dicyclohexylmethylsilane, dicyclohexylethylsilane, dicyclohexyl-n-propylsilane, dicyclohexyl-n-butylsilane, dicyclohexyldiisobutylsilane, dicyclohexyl-sec-butylsilane, dicyclohexyl-n-hexylsilane, dicyclohexylcyclopentylsilane, dicyclohexylcyclopentadienylsilane, dicyclohexylphenylsilane, tricyclohexylsilane, tricyclohexylmethylsilane, tricyclohexylethylsilane, tricyclohexyl-n-propylsilane, tricyclohexyl-n-butylsilane, tricyclohexylisobutylsilane, tricyclohexyl-sec-butylsilane, tricyclohexyl-n-hexylsilane, tricyclohexylcyclopentylsilane, tricyclohexylcyclopentadienylsilane, tricyclohexylphenylsilane, and tetracyclohexylsilane;
and
disilanes such as
1,3-diisopropyldisilane,
1,3-diisopropyl-1,3-dimethyldisilane, 1,3-diisopropyl-1,3-diethyldisilane, 1,3-diisopropyl-1,3-divinyldisilane, 1,3-diisopropyl-1,3-di-n-propyldisilane, 1,1,3,3-tetraisopropyldisilane, 1,3-diisopropyl-1,3-di-n-butyldisilane, 1,3-diisopropyl-1,3-diisobutyldisilane, 1,3-diisopropyl-1,3-di-sec-butyldisilane, 1,3-diisopropyl-1,3-diphenyldislane,
1,3-diisopropyl-1,1,3,3-tetramethyldisilane, 1,3-diisopropyl-1,1,3,3-tetraethyldisilane, 1,3-diisopropyl-1,1,3,3-tetravinyldisilane, 1,3-diisopropyl-1,1,3,3-tetra-n-propyldisilane, 1,3-diisopropyl-1,1,3,3-tetra-n-butyldisilane, 1,3-diisopropyl-1,1,3,3-tetraisobutyldisilane, 1,3-diisopropyl-1,1,3,3-tetra-sec-butyldisilane, 1,3-diisopropyl-1,1,3,3-tetraphenyldislane,
1,1,3,3-tetraisopropyl-1,3-dimethyldisilane, 1,1,3,3-tetraisopropyl-1,3-diethyldisilane, 1,1,3,3-tetraisopropyl-1,3-divinyldisilane, 1,1,3,3-tetraisopropyl-1,3-di-n-propyldisilane, 1,1,3,3-tetraisopropyl-1,3-di-n-propyldisilane, 1,1,3,3-tetraisopropyl-1,3-di-n-butyldisilane, 1,1,3,3-tetraisopropyl-1,3-diisobutyldisilane, 1,1,3,3-tetraisopropyl-1,3-di-sec-butyldisilane, 1,1,3,3-tetraisopropyl-1,3-diphenyldislane, 1,1,1,3,3,3-hexaisopropyldisilane,
1,3-di-sec-butyldisilane,
1,3-di-sec-butyl-1,3-dimethyldisilane, 1,3-di-sec-butyl-1,3-diethyldisilane, 1,3-di-sec-butyl-1,3-divinyldisilane, 1,3-di-sec-butyl-1,3-di-n-propyldisilane, 1,1,3,3-tetra-sec-butyldisilane, 1,3-di-sec-butyl-1,3-di-n-butyldisilane, 1,3-di-sec-butyl-1,3-diisobutyldisilane, 1,3-di-sec-butyl-1,3-di-sec-butyldisilane, 1,3-di-sec-butyl-1,3-diphenyldislane,
1,3-di-sec-butyl-1,1,3,3-tetramethyldisilane, 1,3-di-sec-butyl-1,1,3,3-tetraethyldisilane, 1,3-di-sec-butyl-1,1,3,3-tetravinyldisilane, 1,3-di-sec-butyl-1,1,3,3-tetra-n-propyldisilane, 1,3-di-sec-butyl-1,1,3,3-tetra-n-butyldisilane, 1,3-di-sec-butyl-1,1,3,3-tetraisobutyldisilane, 1,3-di-sec-butyl-1,1,3,3-tetra-sec-butyldisilane, 1,3-di-sec-butyl-1,1,3,3-tetraphenyldislane,
1,1,3,3-tetra-sec-butyl-1,3-dimethyldisilane, 1,1,3,3-tetra-sec-butyl-1,3-diethyldisilane, 1,1,3,3-tetra-sec-butyl-1,3-divinyldisilane, 1,1,3,3-tetra-sec-butylisopropyl-1,3-di-n-propyldisilane, 1,1,3,3-tetra-sec-butyl-1,3-di-n-propyldisilane, 1,1,3,3-tetra-sec-butyl-1,3-di-n-butyldisilane, 1,1,3,3-tetra-sec-butyl-1,3-diisobutyldisilane, 1,1,3,3-tetra-sec-butyl-1,3-di-sec-butyldisilane, 1,1,3,3-tetra-sec-butyl-1,3-diphenyldislane, 1,1,1,3,3,3-hexa-sec-butyldisilane,
1,3-dicyclopentyldisilane,
1,3-dicyclopentyl-1,3-dimethyldisilane, 1,3-dicyclopentyl-1,3-diethyldisilane, 1,3-dicyclopentyl-1,3-divinyldisilane, 1,3-dicyclopentyl-1,3-di-n-propyldisilane, 1,1,3,3-tetracyclopentyldisilane, 1,3-dicyclopentyl-1,3-di-n-butyldisilane, 1,3-dicyclopentyl-1,3-diisobutyldisilane, 1,3-dicyclopentyl-1,3-di-sec-butyldisilane, 1,3-dicyclopentyl-1,3-diphenyldislane,
1,3-dicyclopentyl-1,1,3,3-tetramethyldisilane, 1,3-dicyclopentyl-1,1,3,3-tetraethyldisilane, 1,3-dicyclopentyl-1,1,3,3-tetravinyldisilane, 1,3-dicyclopentyl-1,1,3,3-tetra-n-propyldisilane, 1,3-dicyclopentyl-1,1,3,3-tetra-n-butyldisilane, 1,3-dicyclopentyl-1,1,3,3-tetraisobutyldisilane, 1,3-dicyclopentyl-1,1,3,3-tetra-sec-butyldisilane, 1,3-dicyclopentyl-1,1,3,3-tetraphenyldislane,
1,1,3,3-tetracyclopentyl-1,3-dimethyldisilane, 1,1,3,3-tetracyclopentyl-1,3-diethyldisilane, 1,1,3,3-tetracyclopentyl-1,3-divinyldisilane, 1,1,3,3-tetracyclopentyl-1,3-di-n-propyldisilane, 1,1,3,3-tetracyclopentyl-1,3-di-n-propyldisilane, 1,1,3,3-tetracyclopentyl-1,3-di-n-butyldisilane, 1,1,3,3-tetracyclopentyl-1,3-diisobutyldisilane, 1,1,3,3-tetracyclopentyl-1,3-di-sec-butyldisilane, 1,1,3,3-tetracyclopentyl-1,3-diphenyldislane, 1,1,1,3,3,3-hexacyclopentyldislane,
1,3-dicyclopentadienyldisilane,
1,3-dicyclopentadienyl-1,3-dimethyldisilane, 1,3-dicyclopentadienyl-1,3-diethyldisilane, 1,3-dicyclopentadienyl-1,3-divinyldisilane, 1,3-dicyclopentadienyl-1,3-di-n-propyldisilane, 1,1,3,3-tetracyclopentadienyldisilane, 1,3-dicyclopentadienyl-1,3-di-n-butyldisilane, 1,3-dicyclopentadienyl-1,3-diisobutyldisilane, 1,3-dicyclopentadienyl-1,3-di-sec-butyldisilane, 1,3-dicyclopentadienyl-1,3-diphenyldislane,
1,3-dicyclopentadienyl-1,1,3,3-tetramethyldisilane, 1,3-dicyclopentadienyl-1,1,3,3-tetraethyldisilane, 1,3-dicyclopentadienyl-1,1,3,3-tetravinyldisilane, 1,3-dicyclopentadienyl-1,1,3,3-tetra-n-propyldisilane, 1,3-dicyclopentadienyl-1,1,3,3-tetra-n-butyldisilane, 1,3-dicyclopentadienyl-1,1,3,3-tetraisobutyldisilane, 1,3-dicyclopentadienyl-1,1,3,3-tetra-sec-butyldisilane, 1,3-dicyclopentadienyl-1,1,3,3-tetraphenyldislane,
1,1,3,3-tetracyclopentadienyl-1,3-dimethyldisilane, 1,1,3,3-tetracyclopentadienyl-1,3-diethyldisilane, 1,1,3,3-tetracyclopentadienyl-1,3-divinyldisilane, 1,1,3,3-tetracyclopentadienyl-1,3-di-n-propyldisilane, 1,1,3,3-tetracyclopentadienyl-1,3-di-n-propyldisilane, 1,1,3,3-tetracyclopentadienyl-1,3-di-n-butyldisilane, 1,1,3,3-tetracyclopentadienyl-1,3-diisobutyldisilane, 1,1,3,3-tetracyclopentadienyl-1,3-di-sec-butyldisilane, 1,1,3,3-tetracyclopentadienyl-1,3-diphenyldislane, 1,1,1,3,3,3-hexacyclopentadienyldisilane,
1,3-dicyclohexyldisilane,
1,3-dicyclohexyl-1,3-dimethyldisilane, 1,3-dicyclohexyl-1,3-diethyldisilane, 1,3-dicyclohexyl-1,3-divinyldisilane, 1,3-dicyclohexyl-1,3-di-n-propyldisilane, 1,1,3,3-tetracyclohexyldisilane, 1,3-dicyclohexyl-1,3-di-n-butyldisilane, 1,3-dicyclohexyl-1,3-diisobutyldisilane, 1,3-dicyclohexyl-1,3-di-sec-butyldisilane, 1,3-dicyclohexyl-1,3-diphenyldislane,
1,3-dicyclohexyl-1,1,3,3-tetramethyldisilane, 1,3-dicyclohexyl-1,1,3,3-tetraethyldisilane, 1,3-dicyclohexyl-1,1,3,3-tetravinyldisilane, 1,3-dicyclohexyl-1,1,3,3-tetra-n-propyldisilane, 1,3-dicyclohexyl-1,1,3,3-tetra-n-butyldisilane, 1,3-dicyclohexyl-1,1,3,3-tetraisobutyldisilane, 1,3-dicyclohexyl-1,1,3,3-tetra-sec-butyldisilane, 1,3-dicyclohexyl-1,1,3,3-tetraphenyldislane,
1,1,3,3-tetracyclohexyl-1,3-dimethyldisilane, 1,1,3,3-tetracyclohexyl-1,3-diethyldisilane, 1,1,3,3-tetracyclohexyl-1,3-divinyldisilane, 1,1,3,3-tetracyclohexyl-1,3-di-n-propyldisilane, 1,1,3,3-tetracyclohexyl-1,3-di-n-propyldisilane, 1,1,3,3-tetracyclohexyl-1,3-di-n-butyldisilane, 1,1,3,3-tetracyclohexyl-1,3-diisobutyldisilane, 1,1,3,3-tetracyclohexyl-1,3-di-sec-butyldisilane, 1,1,3,3-tetracyclohexyl-1,3-diisobutyldisilane, 1,1,3,3-tetracyclohexyl-1,3-diphenyldislane, and 1,1,1,3,3,3-hexacyclohexyldisilane.

Other examples include chain polysilanes such as
1,2,3-triisopropyltrisilane, 1,1,2,2,3,3-hexaisopropyltrisilane, 1,2,3-hexaisopropyl-1,2,3-trimethyltrisilane, 1,2,3-hexaisopropyl-1,1,2,3,3-pentamethyltrisilane, 1,2,3,4-tetraisopropyltetrasilane, 1,1,2,2,3,3,4,4-octaisopropyltetrasilane, 1,2,3,4,5-pentaisopropylpentasilane, 1,1,2,2,3,3,4,4,5,5-decaisopropylpentasilane, 1,2,3-tri-sec-butyltrisilane, 1,1,2,2,3,3-hexa-sec-butyltrisilane, 1,2,3,4-tetra-sec-butyltetrasilane, 1,1,2,2,3,3,4,4-octa-sec-butyltetrasilane, 1,2,3,4,5-penta-sec-butylpentasilane, and 1,1,2,2,3,3,4,4,5,5-deca-sec-butylpentasilane, Among others, isopropylsilane, isopropylmethylsilane, isopropyldimethylsilane, diisopropylsilane, diisopropylmethylsilane, triisopropylsilane, sec-butylsilane, sec-butylmethylsilane, sec-butyldimethylsilane, di-sec-butylsilane, di-sec-butylmethylsilane, tri-sec-butylsilane and the like are preferred.

Specific examples of the cyclic silane compound represented by formula (3) include cyclic polysilanes such as 1,2,3,4-tetraisopropylcyclotetrasilane, 1,2,3,4,5-pentaisopropylcyclopentasilane, 1,2,3,4,5,6-hexaisopropylcyclohexasilane, 1,1,2,2,3,3,4,4-octaisopropylcyclotetrasilane, 1,1,2,2,3,3,4,4,5,5-decaisopropylcyclopentasilane, 1,1,2,2,3,3,4,4,5,5,6,6-undecaisopropylcyclohexasilane, 1,2,3,4-tetraisopropyl-1,2,3,4-tetramethylcyclotetrasilane, 1,2,3,4-tetraisopropyl-1,2,3,4-tetraethylcyclotetrasilane, 1,2,3,4-tetraisopropyl-1,2,3,4-tetraphenylcyclotetrasilane, 1,2,3,4,5-pentaisopropyl-1,2,3,4,5-pentamethylcyclopentasilane, 1,2,3,4,5-pentaisopropyl-1,2,3,4,5-pentaethylcyclopentasilane, 1,2,3,4,5-pentaisopropyl-1,2,3,4,5-pentaphenylcyclopentasilane, 1,2,3,4,5,6-hexaisopropyl-1,2,3,4,5,6-hexamethylcyclohexasilane, 1,2,3,4,5,6-hexaisopropyl-1,2,3,4,5,6-hexaethylcyclohexasilane, 1,2,3,4,5,6-hexaisopropyl-1,2,3,4,5,6-hexaphenylcyclohexasilane, 1,2,3,4-tetra-sec-butylcyclotetrasilane, 1,2,3,4,5-penta-sec-butylcyclopentasilane, 1,2,3,4,5,6-hexa-sec-butylcyclohexasilane, 1,1,2,2,3,3,4,4-octa-sec-butylcyclotetrasilane, 1,1,2,2,3,3,4,4,5,5-deca-sec-butylcyclopentasilane, 1,1,2,2,3,3,4,4,5,5,6,6-undeca-sec-butylcyclohexasilane, 1,2,3,4-tetra-sec-butyl-1,2,3,4-tetramethylcyclotetrasilane, 1,2,3,4-tetra-sec-butyl-1,2,3,4-tetraethylcyclotetrasilane, 1,2,3,4-tetra-sec-butyl-1,2,3,4-tetraphenylcyclotetrasilane, 1,2,3,4,5-penta-sec-butyl-1,2,3,4,5-pentamethylcyclopentasilane, 1,2,3,4,5-penta-sec-butyl-1,2,3,4,5-pentaethylcyclopentasilane, 1,2,3,4,5-penta-sec-butyl-1,2,3,4,5-pentaphenylcyclopentasilane, 1,2,3,4,5,6-hexa-sec-butyl-1,2,3,4,5,6-hexamethylcyclohexasilane, 1,2,3,4,5,6-hexa-sec-butyl-1,2,3,4,5,6-hexaethylcyclohexasilane, 1,2,3,4,5,6-hexa-sec-butyl-1,2,3,4,5,6-hexaphenylcyclohexasilane, 1,2,3,4-tetracyclopentylcyclotetrasilane, 1,2,3,4,5-pentacyclopentylcyclopentasilane, 1,2,3,4,5,6-hexacyclopentylcyclopentylcyclohexasilane, 1,1,2,2,3,3,4,4-octacyclopentylcyclotetrasilane, 1,1,2,2,3,3,4,4,5,5-decacyclopentylcyclopentasilane, 1,1,2,2,3,3,4,4,5,5,6,6-undecacyclopentylcyclohexasilane, 1,2,3,4-tetracyclopentyl-1,2,3,4-tetramethylcyclotetrasilane, 1,2,3,4-tetracyclopentyl-1,2,3,4-tetraethylcyclotetrasilane, 1,2,3,4-tetracyclopentyl-1,2,3,4-tetraphenylcyclotetrasilane, 1,2,3,4,5-pentacyclopentyl-1,2,3,4,5-pentamethylcyclopentasilane, 1,2,3,4,5-pentacyclopentyl-1,2,3,4,5-pentaethylcyclopentasilane, 1,2,3,4,5-pentacyclopentyl-1,2,3,4,5-pentaphenylcyclopentasilane, 1,2,3,4,5,6-hexacyclopentyl-1,2,3,4,5,6-hexamethylcyclohexasilane, 1,2,3,4,5,6-hexacyclopentyl-1,2,3,4,5,6-hexaethylcyclohexasilane, 1,2,3,4,5,6-hexacyclopentyl-1,2,3,4,5,6-hexaphenylcyclohexasilane,

1,2,3,4-tetracyclopentadienylcyclotetrasilane, 1,2,3,4,5-pentacyclopentadienylcyclopentasilane, 1,2,3,4,5,6-hexacyclopentadienylcyclohexasilane, 1,1,2,2,3,3,4,4-octacyclopentadienylcyclotetrasilane, 1,1,2,2,3,3,4,4,5,5-decacyclopentadienylcyclopentasilane, 1,1,2,2,3,3,4,4,5,5,6,6-undecacyclopentadienylcyclohexasilane, 1,2,3,4-tetracyclopentadienyl-1,2,3,4-tetramethylcyclotetrasilane, 1,2,3,4-tetracyclopentadienyl-1,2,3,4-tetraethylcyclotetrasilane, 1,2,3,4-tetracyclopentadienyl-1,2,3,4-tetraphenylcyclotetrasilane, 1,2,3,4,5-pentacyclopentadienyl-1,2,3,4,5-pentamethylcyclopentasilane, 1,2,3,4,5-pentacyclopentadienyl-1,2,3,4,5-pentaethylcyclopentasilane, 1,2,3,4,5-pentacyclopentadienyl-1,2,3,4,5-pentaphenylcyclopentasilane, 1,2,3,4,5,6-hexacyclopentadienyl-1,2,3,4,5,6-hexamethylcyclohexasilane, 1,2,3,4,5,6-hexacyclopentadienyl-1,2,3,4,5,6-hexaethylcyclohexasilane, 1,2,3,4,5,6-hexacyclopentadienyl-1,2,3,4,5,6-hexaphenylcyclohexasilane, 1,2,3,4-tetracyclohexylcyclotetrasilane, 1,2,3,4,5-hexycyclopentylcyclopentasilane, 1,2,3,4,5,6-hexacyclohexylcyclopentylcyclohexasilane, 1,1,2,2,3,3,4,4-octacyclohexylcyclotetrasilane, 1,1,2,2,3,3,4,4,5,5-decacyclohexylcyclopentasilane, 1,1,2,2,3,3,4,4,5,5,6,6-undecacyclohexylcyclohexasilane, 1,2,3,4-tetracyclohexyl-1,2,3,4-tetramethylcyclotetrasilane, 1,2,3,4-tetracyclohexyl-1,2,3,4-tetraethylcyclotetrasilane, 1,2,3,4-tetracyclohexyl-1,2,3,4-tetraphenylcyclotetrasilane, 1,2,3,4,5-pentacyclohexyl-1,2,3,4,5-pentamethylcyclopentasilane, 1,2,3,4,5-pentacyclohexyl-1,2,3,4,5-pentaethylcyclopentasilane, 1,2,3,4,5-pentacyclohexyl-1,2,3,4,5-pentaphenylcyclopentasilane, 1,2,3,4,5,6-hexacyclohexyl-1,2,3,4,5,6-hexamethylcyclohexasilane, 1,2,3,4,5,6-hexacyclohexyl-1,2,3,4,5,6-hexaethylcyclohexasilane, and 1,2,3,4,5,6-hexacyclohexyl-1,2,3,4,5,6-hexaphenylcyclohexasilane.

Among others, 1,2,3,4-tetraisopropylcyclotetrasilane, 1,2,3,4,5-pentaisopropylcyclopentasilane, 1,2,3,4,5,6-hexaisopropylcyclohexasilane, 1,1,2,2,3,3,4,4-octaisopropylcyclotetrasilane, 1,1,2,2,3,3,4,4,5,5-decaisopropylcyclopentasilane, 1,1,2,2,3,3,4,4,5,5,6,6-undecaisopropylcyclohexasilane, and the like are preferred.

The production method for the silane compound and cyclic silane compound of formulae (2) and (3) is not particularly limited, but each compound can be produced by reacting an organic compound represented by the following formula (8):

[Chem. 11]

(8)

(wherein $R^5$, $R^6$ and $R^9$ are the same as respective members in formula (2), and each X represents a hydrogen atom, a chlorine atom, a bromine atom or an iodine atom) or represented by the following formula (9):

[Chem. 12]

(9)

(wherein $R^{10}$, $R^{11}$ and $R^{12}$ are the same as respective members in formula (3), and each X represents a hydrogen atom, a chlorine atom, a bromine atom or an iodine atom) with a metal lithium particle.

In the case where an unreacted halogen substituent remains, the unreacted halogen substituent may be alkylated by the reaction with a lithium or magnesium compound obtained from formula (5) or may be hydrogenated by the reaction with lithium aluminum hydride or sodium borate.

The production conditions for the silane compound and cyclic silane compound of formulae (2) and (3) are not particularly limited, but the production conditions for the disiloxane compound of formula (1) may be employed.

The organosilicon compound having, as in formulae (1) to (3) of the present invention, a secondary hydrocarbon group directly bonded to at least one silicon atom and having an atomic ratio of 0.5 or less oxygen atom with respect to 1 silicon atom can form a carbon-containing silicon oxide film through deposition by CVD, and the film can be used as a sealing film. CVD includes, for example, PECVD and a catalytic chemical vapor deposition method. The kind of PECVD and the apparatus used therefor are not particularly limited, but PECVD generally employed in this technical field such as semiconductor production field, liquid display production field and surface treatment field of roll-to-roll polymer film is used.

In the PECVD set up, the organosilicon compound of the present invention is vaporized by a vaporizer and introduced into a deposition chamber, and a voltage is applied to an electrode in the deposition chamber by means of a high-frequency power source to generate plasma, whereby a plasma CVD thin film can be formed on a silicon substrate or the like in the deposition chamber. At this time, introducing an inert gas, such as helium, argon, krypton, neon and xenon, together with the organosilicon compound so as to generate plasma is also encompassed by the scope of the present invention.

The plasma generation method of the PECVD set up is not particularly limited, and inductively coupled plasma, capacitively coupled plasma, ECR plasma and the like, which are used in this art, can be used. As the plasma generation source, various types such as parallel plate type and antenna type can be used, and PECVD under any pressure condition such as atmospheric-pressure PECVD, reduced-pressure PECVD or compressive PECVD can be used.

At this time, the PECVD conditions are not particularly limited, but the chemical vapor deposition is preferably performed at 1.0 to 10,000 W, more preferably from 1.0 to 2,000 W.

Also, a film densified or increased in the mechanical strength can be sometimes obtained by subjecting a sealing film composed of the above-described carbon-containing silicon oxide film to a heat treatment, an ultraviolet irradiation treatment and/or an electron beam treatment, and the film obtained after such a treatment may be suitable as a gas barrier film.

The sealing film of the present invention can be used for an FPD device, a semiconductor device and the like.

Figure 1:
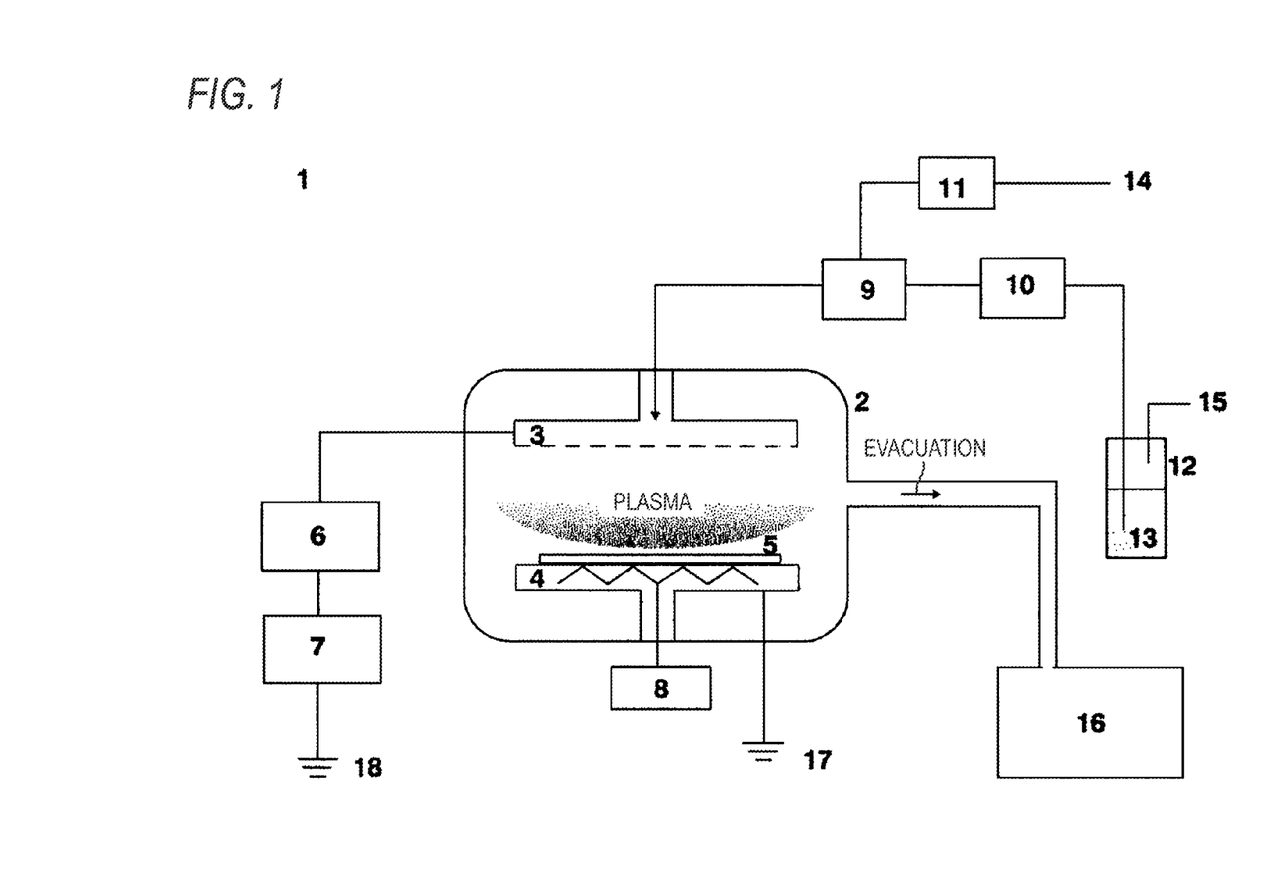
FIG. 1 A view depicting a parallel plate capacitively coupled PECVD set up.

As the PECVD set up, FIG. 1 specifically depicts a parallel plate capacitively coupled PECVD apparatus 1. The parallel plate capacitively coupled PECVD apparatus shown in FIG. 1 has a shower head upper electrode, a lower electrode capable of controlling the temperature of a substrate, which are provided in a PECVD apparatus chamber, a vaporization device for vaporizing the raw material compound and feeding the vapor to the chamber, a plasma generation device composed of a high-frequency power source and a matching circuit, and an evacuation system composed of a vacuum pump.

The PECVD apparatus 1 consists of a PECVD chamber 2, an upper electrode 3 having a shower head for uniformly feeding the raw material compound into the chamber, a lower electrode 4 having a temperature control device 8 and allowing a thin film-forming substrate 5 such as Si substrate to be placed thereon, vaporization devices 9 to 15 for vaporizing the raw material compound, a plasma generation source, that is, a matching circuit 6 and an RF power source 7, and an evacuation device 16 for discharging unreacted materials and by-products from the chamber. Each of 17 and 18 is a ground wire.

The matching circuit 6 and RF power source 7, which are a plasma generation source, are connected to the upper electrode 3, and plasma is generated by a discharge. The standards of the RF power source 7 are not particularly limited, but an RF power source employed in this technical field, having an electric power of 1 to 2,000 W, preferably from 10 to 1,000 W, and a frequency of 50 kHz to 2.5 GHz, preferably from 100 kHz to 100 MHz, more preferably from 200 kHz to 50 MHz, may be used.

The control of substrate temperature is not particularly limited, but the temperature is from −90 to 1,000° C., preferably from 0° C. to 500° C.

The vaporization device consists of a container 12 filled with the raw material compound 13 that is a liquid at ordinary temperature and atmospheric pressure, and equipped with a dip pipe and a pipe 15 for applying a pressure from the above-described insert gas, a liquid flow rate control device 10 for controlling the flow rate of the raw material compound 13 in a liquid state, a vaporizer 9 for vaporizing the liquid-state raw material compound 13, a pipe 14 for feeding the inert gas into the PECVD apparatus chamber via the vaporizer, and a gas flow rate control device 11 for controlling the flow rate of the insert gas. The vaporization device is pipe-connected from the vaporizer 9 to the upper electrode 3 having a shower head.

The vapor feed rate of the raw material compound into the chamber is not particularly limited but is from 0.1 to 10,000 sccm, preferably from 10 to 5,000 sccm. Also, the feed rate of the inert gas is not particularly limited but is from 0.1 to 10,000 sccm, preferably from 10 to 5,000 sccm.

Figure 2:
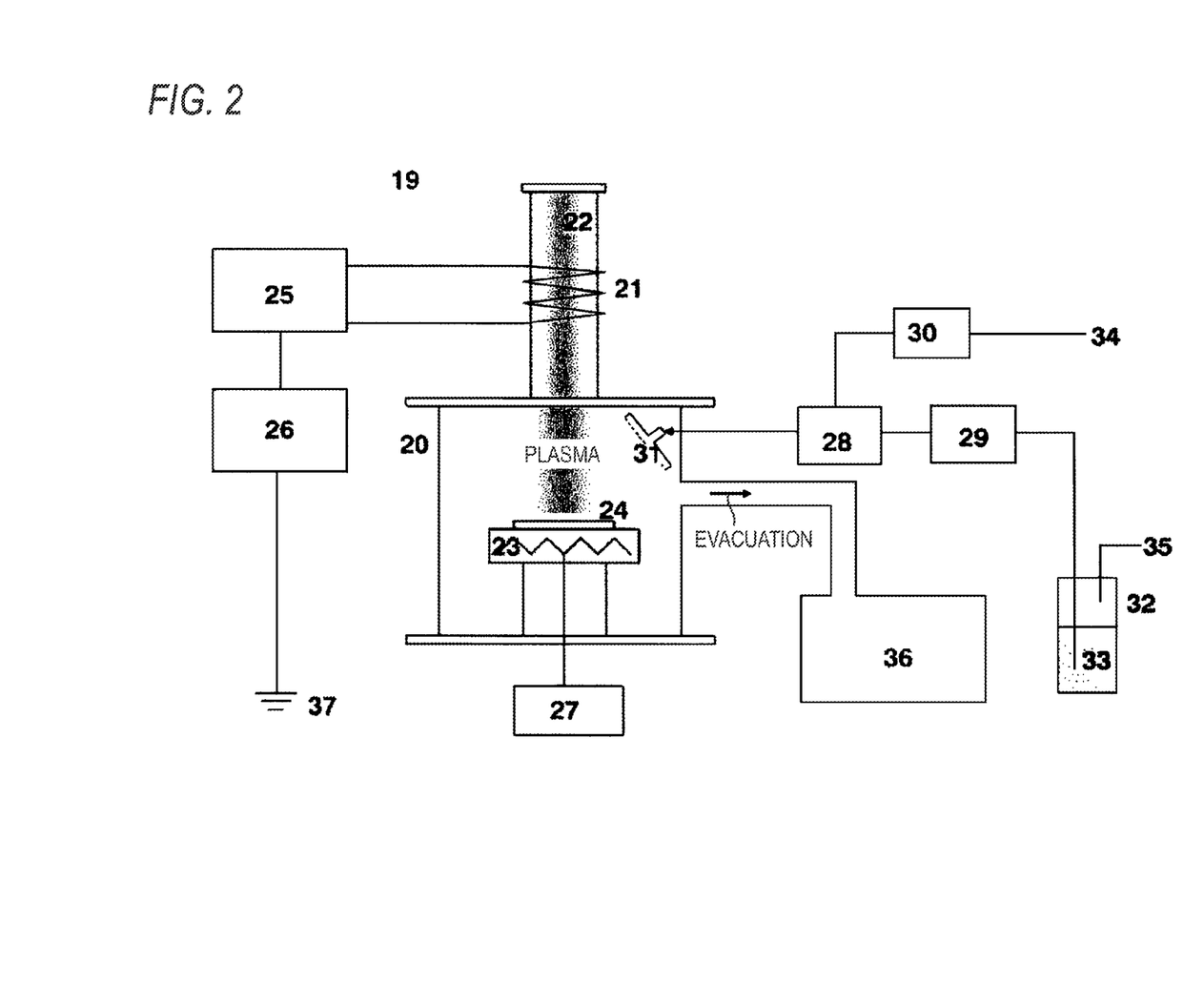
FIG. 2 A view depicting an inductively coupled remote PECVD set up.

As the PECVD apparatus, FIG. 2 specifically depicts an inductively coupled remote PECVD apparatus 19. The inductively coupled remote PECVD apparatus shown in FIG. 2 has a plasma generation part wound like a coil around quartz on the top of a PECVD apparatus chamber, a temperature-controllable substrate setting part, a vaporizer device for vaporizing the raw material compound and feeding the vapor to the chamber, a plasma generation device composed of a high-frequency power source and a matching circuit, and an evacuation system composed of a vacuum pump.

The PECVD apparatus 19 consists of a PECVD chamber 20, a plasma generation part, that is, a coil 21 and a quartz tube 22, a heater part 23 for placing a thin film-forming substrate 24 such as Si substrate thereon, a temperature control device 27, vaporization devices 28 to 35 for vaporizing the raw material compound, a plasma generation source, that is, a matching circuit 25 and an RF power source 26, and an evacuation device 36 for discharging unreacted materials and by-products from the chamber. Also, 37 is a ground wire.

The coil around the quartz as a plasma generation part is connected to the matching circuit 25, and a discharge is caused to occur in the quartz tube by an antenna current magnetic field from RF current. The standards of the RF power source 26 are not particularly limited, but an RF power source employed in this technical field, having an electric power of 1 to 2,000 W, preferably from 10 to 1,000 W, and a frequency of 50 kHz to 2.5 GHz, preferably from 100 kHz to 100 MHz, more preferably from 200 kHz to 50 MHz, may be used.

The control of substrate temperature is not particularly limited, but the temperature is from −90 to 1,000° C., preferably from 0° C. to 500° C.

The vaporization device consists of a container 32 filled with the raw material compound 33 that is a liquid at ordinary temperature and atmospheric pressure, and equipped with a dip pipe and a pipe 35 for applying a pressure from the above-described insert gas, a liquid flow rate control device 29 for controlling the flow rate of the raw material compound 33 in a liquid state, a vaporizer 28 for vaporizing the liquid-state raw material compound 33, a pipe 34 for feeding the inert gas into the PECVD apparatus chamber via the vaporizer, a gas flow rate control device 30 for controlling the flow rate of the insert gas, and a shower head 31 for uniformly feeding the inert gas and the gasified raw material compound 33 into the chamber.

The vapor feed rate of the raw material compound into the chamber is not particularly limited but is from 0.1 to 10,000 sccm, preferably from 10 to 5,000 sccm. Also, the feed rate of the inert gas is not particularly limited but is from 0.1 to 10,000 sccm, preferably from 10 to 5,000 sccm.

The raw material compound is gasified using the PECVD apparatus illustrated above and after feeding the inert gas and the gasified raw material compound or feeding the gasified raw material into the chamber, plasma is generated by a discharge using an RF power source to deposit a film on a temperature-controlled substrate. At this time, the pressure in the chamber is not particularly limited but is from 0.1 to 10,000 Pa, preferably from 1 to 5,000 Pa.

Figure 3:
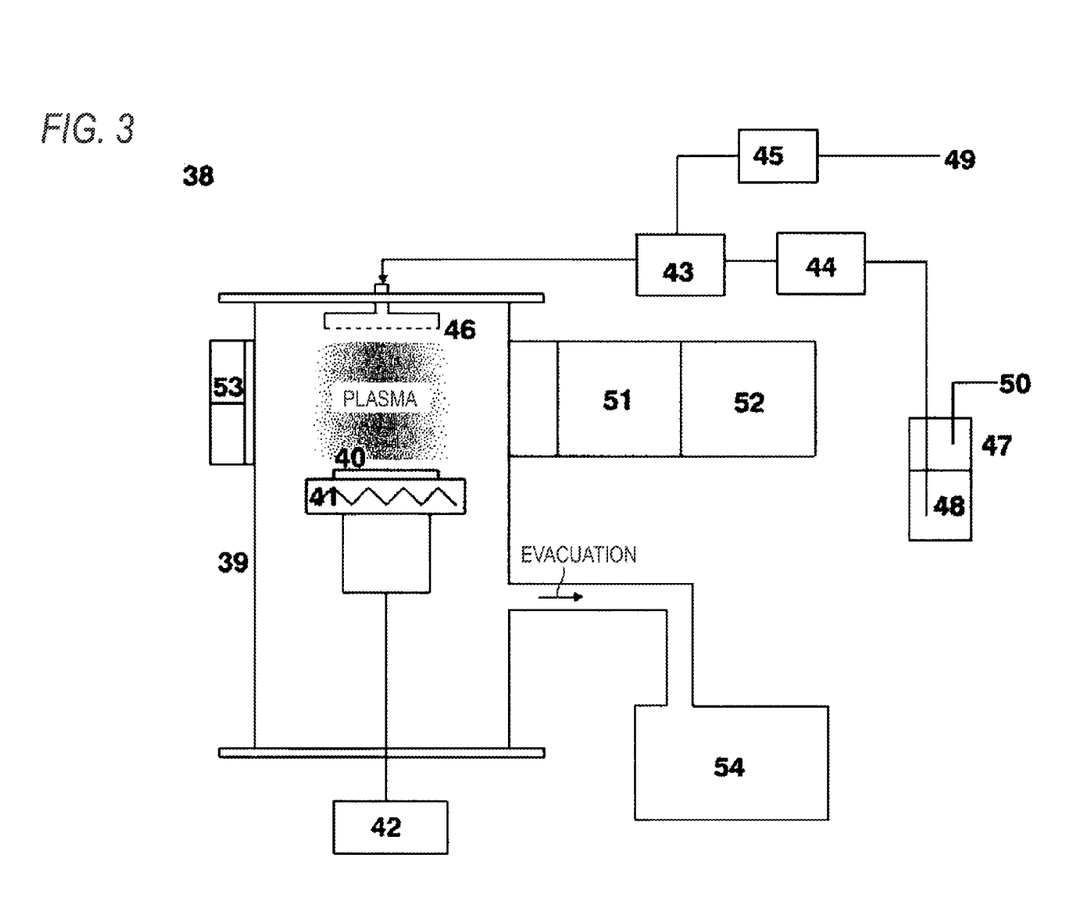
FIG. 3 A view depicting a microwave PECVD set up.

As the PECVD apparatus, FIG. 3 specifically depicts a microwave PECVD apparatus 38. This apparatus consists of a quartz-made chamber 39, a heater part 41 for placing a thin film-forming substrate 40 such as Si substrate thereon, a temperature control device 42, vaporization devices 43 to 50 for vaporizing the raw material compound, a microwave generation source, that is, a matching circuit 51 and a microwave transmitter 52, a microwave reflector 53, and an evacuation device 54 for discharging unreacted materials and byproducts from the chamber.

The matching circuit 51 and microwave transmitter 52, which are a microwave generation source, are connected to the quartz chamber, and the inside of the quartz chamber is irradiated with microwave to generate plasma. The microwave frequency is not particularly limited, but a microwave employed in this technical field, having a frequency of 1 MHz to 50 GHz, preferably from 0.5 to 10 GHz, more preferably from 1 to 5 GHz, may be used. As for the microwave output, a microwave of 0.1 to 20,000 W, preferably from 1 to 10,000 W, may be used.

The control of substrate temperature is not particularly limited, but the temperature is from −90 to 1,000° C., preferably from 0° C. to 500° C.

The vaporization device consists of a container 47 filled with the raw material compound 48 that is a liquid at ordinary temperature and atmospheric pressure, and equipped with a dip pipe and a pipe 50 for applying a pressure from the above-described insert gas, a liquid flow rate control device 44 for controlling the flow rate of the raw material compound 48 in a liquid state, a vaporizer 43 for vaporizing the liquid-state raw material compound 48, a pipe 49 for feeding the inert gas into the PECVD apparatus chamber via the vaporizer, a gas flow rate control device 45 for controlling the flow rate of the insert gas, and a shower head 46 for uniformly feeding the inert gas and the gasified raw material compound 48 into the chamber.

The feed rate of the raw material compound vapor into the chamber is not particularly limited but is from 0.1 to 10,000 sccm, preferably from 10 to 5,000 sccm. Also, the feed rate of the inert gas is not particularly limited but is from 0.1 to 10,000 sccm, preferably from 10 to 5,000 sccm.

The raw material compound is gasified using the PECVD apparatus illustrated above and after feeding the inert gas and the gasified raw material compound or feeding the gasified raw material into the chamber, plasma is generated by microwave irradiation to deposit a film on a temperature-controlled substrate. At this time, the pressure in the chamber is not particularly limited but is from 0.1 to 10,000 Pa, preferably from 1 to 5,000 Pa.

EXAMPLES

Working examples are described below, but the present invention is not limited to these Examples.

The film thickness was measured using a stylus surface profile meter, Dektak 6M, manufactured by ULVAC. The composition of the film produced was measured using ESCA5400MC manufactured by Perkin Elmer. The oxygen permeability was measured in conformity with JIS K 7126-1, and the water permeability was measured in conformity with Appendix C of JIS K 7129. The total light transmittance was measured by the method of JIS K 7361-1. The linear expansion coefficient was calculated by heating a film sample in a no-load state at 5 deg./min. from room temperature to 240° C. in an oven and measuring the change in the film thickness during the temperature rise by a CCD camera. The surface roughness was measured using a scanning probe microscope, NanoScope IIa, manufactured by Veecoo by tapping mode AFM.

Example 1

Deposition of a Gas Barrier Layer by Using 1,3-diisopropyl-1,3-dimethyldisiloxane (Compound Represented by Formula (1) where Oxygen/Silicon=0.5) in a Capacitively Coupled PECVD Apparatus A film was deposited on a polyethylene naphthalate film substrate by using a parallel plate capacitively coupled PECVD apparatus shown in FIG. 1. The deposition conditions were a 1,3-diisopropyl-1,3-dimethyldisiloxane flow rate of 50 sccm, a helium gas flow rate of 50 sccm, an oxygen gas flow rate of 50 sccm, an in-chamber pressure of 10 Pa, a substrate temperature of room temperature, an RF source power of 500 W, an RF source frequency of 13.56 MHz, and a deposition time of 10 minutes.

As a result, the film thickness was 2,570 nm. The composition of the carbon-containing silicon oxide sealing film was Si=24 atom %, C=20 atom % and O=56 atom %. When the gas permeability was measured, the oxygen permeability was less than 0.01 cc/m$^2$day (not more than detection limit), and the water permeability was $4.0 \times 10^{-3}$ g/m$^2$day. Also, the total light transmittance was 91.7%, the linear expansion coefficient was 12 ppm/deg., and the surface roughness was 0.25 nm.

Example 2

Deposition of a Gas Barrier Layer by Using 1,3-diisopropyl-1,3-dimethyldisiloxane (Compound Represented by Formula (1) where Oxygen/Silicon=0.5) in a Capacitively Coupled PECVD Apparatus A sealing film was deposited in the same manner as in Example 1 except that in Example 1, the flow rate was changed to 50 sccm for helium and to 100 sccm for oxygen.

As a result, the film thickness was 1,421 nm. When the gas permeability was measured, the oxygen permeability was less than 0.01 cc/$m^2$·day (not more than detection limit), and the water permeability was $2.5 \times 10^{-3}$ g/$m^2$·day. Also, the total light transmittance was 91.6%, the linear expansion coefficient was 11 ppm/deg., and the surface roughness was 0.27 nm.

Example 3

Deposition of a Gas Barrier Layer by Using 1,3-diisopropyl-1,3-dimethyldisiloxane (Compound Represented by Formula (1) where Oxygen/Silicon=0.5) in a Capacitively Coupled PECVD Apparatus A sealing film was deposited in the same manner as in Example 1 except that in Example 1, the flow rate was changed to 50 sccm for helium and to 500 sccm for oxygen.

As a result, the film thickness was 1,050 nm. When the gas permeability was measured, the oxygen permeability was less than 0.01 cc/$m^2$·day (not more than detection limit), and the water permeability was $1.1 \times 10^{-3}$ g/$m^2$·day. Also, the total light transmittance was 91.7%, the linear expansion coefficient was 12 ppm/deg., and the surface roughness was 0.25 nm.

Example 4

Deposition of a Gas Barrier Layer by Using Diisopropylmethylsilane (Compound Represented by Formula (2) where Oxygen/Silicon=0) in a Capacitively Coupled PECVD Apparatus A film was deposited on a polyethylene naphthalate film substrate by using a parallel plate capacitively coupled PECVD apparatus shown in FIG. 1. The deposition conditions were a vaporized diisopropylmethylsilane flow rate of 50 sccm, a helium gas flow rate of 50 sccm, an oxygen gas flow rate of 50 sccm, an in-chamber pressure of 10 Pa, a substrate temperature of room temperature, an RF source power of 500 W, an RF source frequency of 13.56 MHz, and a deposition time of 10 minutes.

As a result, the film thickness was 2,180 nm. The composition of the carbon-containing silicon oxide sealing film was Si=25 atom %, C=16 atom % and O=59 atom %. When the gas permeability was measured, the oxygen permeability was less than 0.01 cc/$m^2$·day (not more than detection limit), and the water permeability was $3.5 \times 10^{-3}$ g/$m^2$·day. Also, the total light transmittance was 91.7%, the linear expansion coefficient was 11 ppm/deg., and the surface roughness was 0.26 nm.

Example 5

Deposition of a Gas Barrier Layer by Using 1,1,2,2,3,3,4,4-octaisopropylcyclotetrasilane (Compound Represented by Formula (3) where Oxygen/Silicon=0) in a Capacitively Coupled PECVD Apparatus A film was deposited on a polyethylene naphthalate film substrate by using a parallel plate capacitively coupled PECVD apparatus shown in FIG. 1. The deposition conditions were a vaporized 1,1,2,2,3,3,4,4-octaisopropylcyclotetrasilane flow rate of 50 sccm, a helium gas flow rate of 50 sccm, an oxygen gas flow rate of 100 sccm, an in-chamber pressure of 10 Pa, a substrate temperature of room temperature, an RF source power of 500 W, an RF source frequency of 13.56 MHz, and a deposition time of 10 minutes.

As a result, the film thickness was 2,830 nm. The composition of the carbon-containing silicon oxide sealing film was Si=27 atom %, C=17 atom % and O=56 atom %. When the gas permeability was measured, the oxygen permeability was less than 0.01 cc/$m^2$·day (not more than detection limit), and the water permeability was $2.4 \times 10^{-3}$ g/$m^2$·day. Also, the total light transmittance was 91.6%, the linear expansion coefficient was 11 ppm/deg., and the surface roughness was 0.28 nm.

Comparative Example 1

Deposition of a Carbon-Containing Silicon Oxide Sealing Film by Using vinyltrimethoxysilane (Oxygen/Silicon=3.0) in a Capacitively Coupled PECVD Apparatus A film was deposited on a polyethylene naphthalate film substrate by using a parallel plate capacitively coupled PECVD apparatus shown in FIG. 1. The deposition conditions were a vaporized vinyltrimethoxysilane flow rate of 50 sccm, a helium gas flow rate of 50 sccm, an in-chamber pressure of 133 Pa, a substrate temperature of room temperature, an RF source power of 200 W, an RF source frequency of 13.56 MHz, and a deposition time of 10 minutes. As a result, the film thickness was 470 nm. The composition of the carbon-containing silicon oxide sealing film was Si=31 atom %, C=20 atom % and O=49 atom %. When the gas permeability was measured, the oxygen permeability was less than 1.44 cc/$m^2$·day, and the water permeability was 1.67 g/$m^2$·day. Also, the total light transmittance was 86.5%, the linear expansion coefficient was 30 ppm/deg., and the surface roughness was 10 nm.

An organosilicon compound having an atomic ratio of 0.5 or less oxygen atom with respect to 1 silicon atom was not used and therefore, the obtained thin film was unsuited for a gas barrier layer.

Comparative Example 2

Deposition of a Carbon-Containing Silicon Oxide Sealing Film by Using tetramethoxysilane (Oxygen/Silicon=4.0) in a Capacitively Coupled PECVD Apparatus A film was deposited on a polyethylene naphthalate film substrate by using a parallel plate capacitively coupled PECVD apparatus shown in FIG. 1. The deposition conditions were a vaporized tetramethoxysilane flow rate of 50 sccm, a helium gas flow rate of 50 sccm, an in-chamber pressure of 133 Pa, a substrate temperature of room temperature, an RF source power of 200 W, an RF source frequency of 13.56 MHz, and a deposition time of 10 minutes.

As a result, the film thickness was 136 nm. The composition of the carbon-containing silicon oxide sealing film was Si=35 atom %, C=13 atom % and O=52 atom %. When the gas permeability was measured, the oxygen permeability was less than 1.75 cc/m²·day, and the water permeability was 1.67 g/m²·day. Also, the total light transmittance was 86.4%, the linear expansion coefficient was 32 ppm/deg., and the surface roughness was 26 nm.

An organosilicon compound having an atomic ratio of 0.5 or less oxygen atom with respect to 1 silicon atom was not used and therefore, the obtained thin film was unsuited for a gas barrier layer.

Comparative Example 3

The gas permeability, total light transmittance, linear expansion coefficient and surface roughness of the polyethylene naphthalate film substrate used were measured, as a result, the oxygen permeability was 21.0 cc/m²·day, and the water permeability was 6.70 g/m²·day. Also, the total light transmittance was 86.9%, the linear expansion coefficient was 35 ppm/deg., and the surface roughness was 1.4 nm.

Example 6

Deposition of a Gas Barrier Layer by Using diisopropylmethylsilane (Compound Represented by Formula (2) where Oxygen/Silicon=0) in a Capacitively Coupled PECVD Apparatus A film was deposited on a polyethylene naphthalate film substrate by using a parallel plate capacitively coupled PECVD apparatus shown in FIG. 1. The deposition conditions were a vaporized diisopropylmethylsilane flow rate of 50 sccm, a helium gas flow rate of 50 sccm, an oxygen gas flow rate of 500 sccm, an in-chamber pressure of 100 Pa, a substrate temperature of room temperature, an RF source power of 1,000 W, an RF source frequency of 13.56 MHz, and a deposition time of 10 minutes.

As a result, the film thickness was 858 nm. The composition of the carbon-containing silicon oxide sealing film was Si=31 atom %, C=9 atom % and O=60 atom %. When the gas permeability was measured, the oxygen permeability was less than 0.01 cc/m²·day (not more than detection limit), and the water permeability was $2.1 \times 10^{-4}$ g/m²·day. Also, the total light transmittance was 91.8%, the linear expansion coefficient was 11 ppm/deg., and the surface roughness was 0.21 nm.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2011-192741) filed on Sep. 5, 2011 and Japanese Patent Application (Patent Application No. 2012-176433) filed on Aug. 8, 2012, the contents of which are incorporated herein by way of reference.

INDUSTRIAL APPLICABILITY

According to the present invention, a film deposition material containing an organosilicon compound having a secondary hydrocarbon group directly bonded to at least one silicon atom and having an atomic ratio of 0.5 or less oxygen atom with respect to 1 silicon atom can be deposited by CVD to form a carbon-containing silicon oxide film, and the film can be used as a sealing film. Above all, this sealing film is very useful as a gas barrier film or a gas barrier layer for a gas barrier substrate. Hence, the industrial value of the present invention is remarkable.

EXPLANATIONS OF REFERENCE SIGNS

1: Parallel plate capacitively coupled PECVD apparatus
2: PECVD Chamber
3: Upper electrode having a shower head
4: Lower Electrode
5: Thin film-forming substrate
6: Matching circuit
7: RF Power source
8: Temperature control device
9: Vaporizer
10: Liquid flow rate control device
11: Gas flow rate control device
12: Container
13: Raw material compound
14: Pipe for feeding an inert gas into PECVD apparatus chamber via vaporizer
15: Pipe for applying a pressure from an insert gas
16: Evacuation device
17: Ground wire
18: Ground wire
19: Inductively coupled remote PECVD apparatus
20: PECVD Chamber
21: Coil
22: Quartz tube
23: Heater part
24: Thin film-forming substrate
25: Matching circuit
26: RF Power source
27: Temperature control device
28: Vaporizer
29: Liquid flow rate control device
30: Gas flow rate control device
31: Shower head
32: Container
33: Raw material compound
34: Pipe for feeding an inert gas into PECVD apparatus chamber via vaporizer
35: Pipe for applying a pressure from an insert gas
36: Evacuation device
37: Ground wire
38: Microwave PECVD apparatus
39: Quartz-made chamber
40: Thin film-forming substrate
41: Heater part
42: Temperature control device
43: Vaporizer
44: Liquid flow rate control device
45: Gas flow rate control device
46: Shower head
47: Container
48: Raw material compound
49: Pipe for feeding an inert gas into PECVD apparatus chamber via vaporizer 50: Pipe for applying a pressure from an insert gas
51: Matching circuit
52: Microwave transmitter
53: Microwave reflector
54: Evacuation device

The invention claimed is:

1. A method for producing a gas barrier sealing film, which comprises:

supplying oxygen and forming a gas barrier sealing film on a plastic substrate by a plasma enhanced chemical vapor deposition performed at 1.0 to 10,000 W using an organosilicon compound having a secondary hydrocarbon group directly bonded to at least one silicon atom and having an atomic ratio of 0.5 or less oxygen atom with respect to 1 silicon atom, the organosilicon compound being represented by the following formula (2):

(2)

wherein each of $R^5$ and $R^6$ represents a hydrocarbon group having a carbon number of 1 to 20, $R^5$ and $R^6$ may bond with each other to form a cyclic structure; $R^7$ represents a branched saturated hydrocarbon group having a carbon number of 1 to 20; $R^8$ represents a linear saturated hydrocarbon group having a carbon number of 1 to 20, and m represents an integer of 1 to 20, wherein flow rate of oxygen is the same as or more than flow rate of the organosilicon compound and the gas barrier sealing film has a water permeability of $3.5 \times 10^{-3}$ g/m²·day or less.

2. The method for producing a gas barrier sealing film according to claim 1, wherein the organosilicon compound represented by the formula (2) is diisopropylmethylsilane, sec-butyldimethylsilane or di-sec-butylmethylsilane.

3. The method for producing a gas barrier sealing film according to claim 1, wherein the organosilicon compound represented by the formula (2) is diisopropylmethylsilane.

4. The method for producing a gas barrier sealing film according to claim 2, wherein the organosilicon compound represented by the formula (2) is diisopropylmethylsilane.

5. The method for producing a gas barrier sealing film according to claim 1, wherein flow rate of oxygen is 1 to 10 times flow rate of the organosilicon compound.

6. The method for producing a gas barrier sealing film according to claim 2, wherein flow rate of oxygen is 1 to 10 times flow rate of the organosilicon compound.

7. The method for producing a gas barrier sealing film according to claim 3, wherein flow rate of oxygen is 1 to 10 times flow rate of the organosilicon compound.

8. The method for producing a gas barrier sealing film according to claim 4, wherein flow rate of oxygen is 1 to 10 times flow rate of the organosilicon compound.

* * * * *